(12) United States Patent
Balucani

(10) Patent No.: US 7,713,871 B2
(45) Date of Patent: May 11, 2010

(54) SYSTEM FOR CONTACTING ELECTRONIC DEVICES AND PRODUCTION PROCESSES THEREOF

(76) Inventor: Marco Balucani, Via Marmolada, 20, I-65016 Montesilvano (IT)

( * ) Notice: Subject to any disclaimer, the term of this patent is extended or adjusted under 35 U.S.C. 154(b) by 305 days.

(21) Appl. No.: 11/821,592

(22) Filed: Jun. 21, 2007

(65) Prior Publication Data

US 2008/0012114 A1  Jan. 17, 2008

Related U.S. Application Data

(63) Continuation-in-part of application No. PCT/EP2004/053637, filed on Dec. 21, 2004.

(51) Int. Cl.
*H01L 21/44* (2006.01)
(52) U.S. Cl. .................. 438/666; 438/618; 257/E23.01
(58) Field of Classification Search ................. 438/618, 438/666; 257/E23.01
See application file for complete search history.

(56) References Cited

U.S. PATENT DOCUMENTS

| | | | |
|---|---|---|---|
| 4,813,129 A | 3/1989 | Karnezos | |
| 6,007,349 A * | 12/1999 | Distefano et al. | 439/71 |
| 6,250,933 B1 | 6/2001 | Khoury et al. | |
| 6,672,876 B1 | 1/2004 | Takekoshi | |
| 2003/0199148 A1 * | 10/2003 | Pannek | 438/406 |

FOREIGN PATENT DOCUMENTS

| | | |
|---|---|---|
| EP | 0295914 A | 12/1988 |
| EP | 0827190 A | 3/1998 |
| WO | WO 98/18615 A | 5/1998 |

OTHER PUBLICATIONS

PCT/EP2004/053637 (WO 98/18615) Search Report 08/16/20-05.

* cited by examiner

*Primary Examiner*—Thao X Le
*Assistant Examiner*—Ajay K Arora
(74) *Attorney, Agent, or Firm*—Kevin D. Jablonski; Graybeal Jackson LLP

(57) ABSTRACT

An embodiment of a system for contacting at least one electronic device having a plurality of contact elements is proposed. The system includes a substrate having a main surface and a plurality of contact terminals projecting from the main surface, wherein each contact terminal includes a core of polymeric material and a covering of conductive material surrounding the core, the covering having an operative portion spaced apart from the main surface for electrically connecting a corresponding contact element and a lateral portion extending between the main surface and the operative portion. In an embodiment, the lateral portion forms an angle with the main surface between 45° and 75°.

15 Claims, 17 Drawing Sheets

SYSTEM FOR CONTACTING ELECTRONIC DEVICES AND PRODUCTION PROCESSES THEREOF

PRIORITY CLAIM

This is a continuation-in-part application which claims priority from PCT/EP2004/053637, published in English, filed Dec. 21, 2004 which are incorporated herein by reference.

TECHNICAL FIELD

An embodiment of the present invention generally relates to the electronics field. More specifically, an embodiment of the present invention relates to the contacting of electronic devices (for example, in a probe card for testing chips made in a wafer of semiconductor material or in the interconnection of one or more chips, especially of the power type).

BACKGROUND

Every electronic device (for example, a circuit integrated in a chip of semiconductor material or a package embedding one or more chips) is provided with multiple electrical contacts; those contacts consist of points at which electrical connections are made to implement any Input/Output (I/O) function of the electronic device.

For example, the electrical contacts of a chip may be in the form of pads (i.e., flat elements generally with rectangular or square shape) or bumps (i.e., non-planar elements generally with a spherical, semi-spherical, ellipsoidal, or cylindrical shape); the bumps can also be mounted on a micro-spring so as to obtain a resilient structure (known as compliant bump). When the chip is embedded in a package, the pads or bumps are connected to corresponding electrical contacts of the package. Typically, the pads of the chip are connected to a lead frame or a circuitized substrate of the package by means of wires (with a technique known as wire-bonding); conversely, the bumps of the chip are directly connected to the substrate of the package (with a technique known as flip-chip). On the other hand, the electrical contacts of the package may be in the form of pins (i.e., slander elements projecting laterally from a body of the package), or bumps (which are formed on an exposed surface of its substrate and are connected to the chip mounted on an opposed surface thereof by means of corresponding vias). For example, the pins can be of the gull-wing type, of the J type, and the like; instead, the packages based on the bumps can be of the Ball Grid Array, or BGA, type (when the chip is wire-bonded to pads of the substrate), or of the Chip Scale Package, or CSP, (when the chip is mounted with the flip-chip technique onto the substrate). Those electrical contacts are typically used to mount the package on a Printed Circuit Board (PCB); the operation can be performed either with a standard technique (in which the pins are welded into corresponding holes of the board) or with the Surface Mounting Technology, or SMT; in the latest case, the electrical contacts of the package are slightly pressed (with a process known as pick-and-place) onto corresponding pads of the board provided with a solder past, and then heated to cause the reflow of the solder past.

Several solutions are available in the art for contacting the electronic devices in a number of applications.

A specific example is the test of the electronic devices, which is used to verify their correct operation. The test can be aimed at either identifying evident defects or potential defects (which could occur after a short life of the electronic device). In the last case, the electronic devices are tested under stress conditions; a typical example is the so called burn-in test, which consists of making the electronic devices work for tens of hours at very high or very low temperature (such as ranging from −50° C. to +150° C.), in order to simulate a long period of operation of the electronic devices at room temperature (25° C.-50° C.). When the electronic devices are tested at the wafer level, the chips are contacted by means of a probe card; this card is provided with multiple probes, each one for contacting a corresponding pad or bump of the chips. On the other hand, when the electronic devices are tested at the package level, they are mounted on sockets of a Burn-In Board (BIB); the sockets have a structure that is similar to the one of the probe cards (or even simpler). In both cases, the probes must have a compliant structure, so as to contact the electronic devices under test correctly (especially at the wafer level).

A solution known in the art for implementing the above-described probes is of using cantilever blades. Another proposed technique is based on the use of micro-springs. Moreover, some available structures exploit a flexible membrane for the probes.

However, the available solutions may not be completely satisfactory in some applications. For example, some probes (such as the cantilever ones) are ineffective in accessing multiple electrical contacts of the electronic devices. Moreover, the proposed structures often require the application of a relatively high force to cause their elastic yield. When the probes must work at Radio Frequency (RF), the membrane architecture is generally required. However, in this case the probes are not resilient at an individual level; besides, these probes are unable to scrub (or penetrate) a native oxide layer (which naturally forms on the pads). In any case, all the probes known in the art damage the bumps; therefore, the bumps must be reflowed after the test to restore their original shape.

Another example is the assembling of power chips (i.e., working at a power higher than a hundred of watts). Currently, the integration of power components in a single chip is not feasible (for either technical or economical reasons). Therefore, the power components of each electronic device (such as diodes, MOS transistors, and IGBTs) are individually integrated into corresponding chips, which are mounted onto a common circuitized substrate; the power chips are then connected to conductive tracks of the substrate with the wire-bonding technique. This technique allows compensating the difference in level between the pads of the power chips and the conductive tracks. The driving circuits for the power chips are instead mounted on a distinct circuitized substrate using the SMT technique (which provides a higher integration). The two substrates (with the power chips and the driving circuits) are then embedded into a single package.

However, this solution strongly hinders the implementation of electronic devices with low electromagnetic emission. Moreover, the heat dissipation of the power chips is not optimized (since it can occur through the substrate only). The above-described solution also limits the performance of the electronic devices in terms of their working frequency.

A similar structure is also used to make packages including generic multiple chips (either of the power type or not), commonly referred to as multi-chip modules. Even in this case, the chips are mounted onto a common circuitized substrate and are wire-bonded to each other (with the structure so obtained that is then embedded into a package). Therefore, the solution known in the art suffers the same drawbacks mentioned above with reference to the wire-bonding technique.

SUMMARY

An embodiment of the present invention is motivated by the need of providing a universal contact terminal structure.

Particularly, an embodiment of the present invention provides a system for contacting one or more electronic devices (which have a plurality of contact elements). The system includes a substrate having a main surface and a plurality of contact terminals projecting from the main surface. Each contact terminal includes a core of polymeric material and a covering of conductive material (which surrounds the core). The covering has an operative portion spaced apart from the main surface (for electrically connecting a corresponding contact element); a lateral portion extends between the main surface and the operative portion. The lateral portion forms an angle with the main surface between 45° and 75°.

The proposed structure can be used in a number of applications (for example, in a probe card for testing chips made in a wafer of semiconductor material, in a socket of a card for testing packages, in the interconnection of power chips, in multi-chip modules, or in the assembling of 3-dimensional packages).

In any case, the terminals can be configured to exhibit excellent mechanical and/or electrical properties.

Particularly, the new shape of the terminals allows obtaining the desired flexibility, but at the same time preserving their fatigue strength.

Moreover, the selected angle allows making systems with a very low pitch of the terminals.

The different embodiments of the invention described in the following may provide additional advantages.

For example, the core could be silicone-based, and it is sealed between one or more metallic layers (on the main surface) and one or more other metallic layers (matching the core).

This implementation provides the best performance of the proposed structure.

A way to further improve the solution is to embed a conductive material into the core.

As a result, the electrical resistance of the terminals can be strongly reduced (without adversely affecting their mechanical characteristics).

In addition or in alternative, the core includes a magnetic material.

This feature can be favorably exploited in some specific applications.

In an embodiment of the invention, the covering ends with a plane surface and the core has a compression strain factor higher than 20%.

This implementation is particular advantageous for contacting the bumps; indeed, the terminals embrace the bumps so as to ensure a good electrical contact.

In a different embodiment of the invention, the covering ends with an edge or a vertex, and the core has a compression strain factor lower than 50%.

On the contrary, this implementation is more advantageous for contacting the pads (since it facilitates the scrub of their native oxide layer).

In an embodiment of the invention, the system includes further contact terminals that project from a further main surface of the substrate (opposite its main surface).

This allows implementing 3-dimensional structures with no wire bonding.

Without detracting from its general applicability, the system according to an embodiment of the invention has been specifically designed for use in a probe card.

The proposed terminals make it possible to obtain probe cards with very high performance.

In a further embodiment of the invention, the system is used as an interconnection element for power chips (with the terminals having different heights).

Therefore, it is possible to compensate the difference in level (between the power chips and the conductive tracks of the printed circuit board where they are mounted) without any wire bonding. The devised solution provides very high performance (in terms of either electromagnetic emission and heat dissipation).

In a still further embodiment of the invention, the system is used as all interconnection element for multiple chips.

Even in this case, it is possible to avoid using any wire-bonding.

A further embodiment of the invention provides an electronic assembly including one or more boards (mounting the power chips) and the interconnection element.

Advantageously, means for driving the power chips is mounted on the substrate of the interconnection element.

This strongly increases the compactness of the assembly.

A still further embodiment of the invention provides a multi-chip module based on the above-described interconnection element.

Another embodiment of the present invention provides a corresponding process of manufacturing the system.

Preferably, the terminals are formed on an exposed surface of a sacrificial structure (including a wafer of semiconductor material having a corresponding working surface).

This solution is very simple but at the same time effective.

In an embodiment of the invention, one or more layers of porous silicon are formed in the wafer.

This feature strongly facilitates the removal of the sacrificial structure at the end of the process.

A way to further improve the solution is to provide two layers of porous silicon, and more specifically an outer layer with a lower porosity and an inner layer with a higher porosity.

The outer layer ensures a good uniformity of the next deposition processes (without impairing the removal of the sacrificial structure).

A suggested choice for the porosity of the outer layer and of the inner layer is lower than 40% and higher than 50%, respectively.

These values are a good compromise between the opposed requirements of uniformity and easy removal.

A specific implementation of the process is based on the etching of a wafer having a crystal plane (acting as an etching stopper), which forms a predefined angle with its working surface.

This technique is particularly advantageous when terminals with a fixed angle of their lateral surfaces are required.

In an embodiment of the invention, the etching process lasts for a time enough to obtain grooves that expose only the crystal plane.

In this way, it is possible to make corresponding terminals ending with an edge or vertex of any desired height (according to the size of corresponding windows that are formed in an etching mask).

Alternatively, the etching process is stopped beforehand.

As a result, grooves for corresponding terminals ending with a plane surface are obtained.

In addition, the same operations are repeated (once or more times) with different sizes of the windows and/or etching times.

This allows obtaining grooves (for the corresponding terminals) of any shape and depth.

A way to improve the solution is to form a further stop layer inside the wafer (parallel to its working surface).

The proposed feature is used to control the depth of the grooves with a high accuracy (irrespective of the duration of the etching process).

Advantageously, this result is achieved by using a layer of semiconductor material with a crystallographic orientation or a concentration of P-type impurities that substantially prevent the etching.

These implementations are very simple but effective.

In a different embodiment of the invention, the grooves for the terminals are made in a photoresist layer that is selectively exposed (with different intensities).

This technique allows obtaining terminals with any desired angle of their lateral surfaces.

BRIEF DESCRIPTION OF THE DRAWINGS

One or more embodiments of the invention as well as features and advantages thereof, will be best understood by reference to the following detailed description, given purely by way of a non-restrictive indication, to be read in conjunction with the accompanying drawings.

In this respect, it is expressly intended that the figures are not necessary drawn to scale and that, unless otherwise indicated, they are merely intended to conceptually illustrate the structures and procedures herein described.

DETAILED DESCRIPTION

Figure 1:
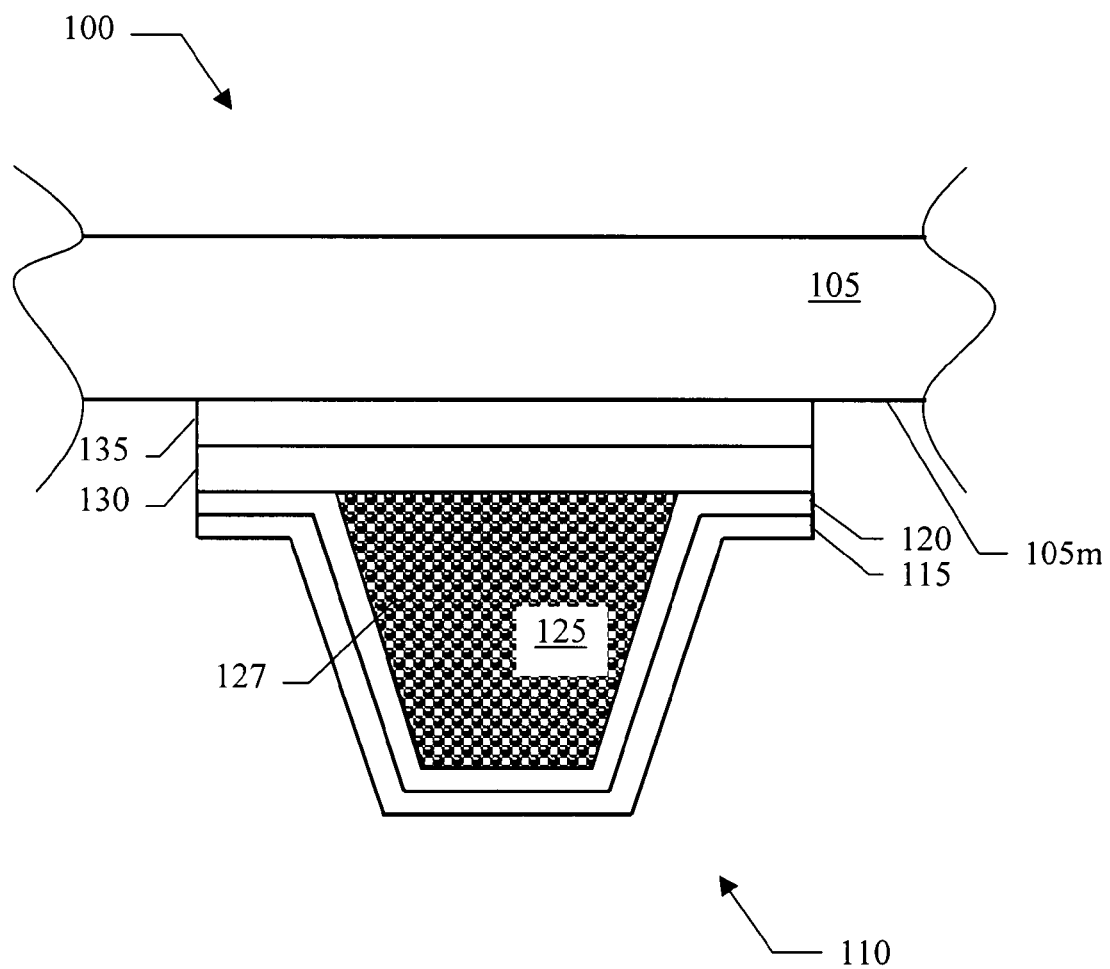
FIG. 1 is a schematic representation of the system according to an embodiment of the invention.

With reference in particular to FIG. 1, there is illustrated a schematic representation of a system 100 for contacting one or more electronic devices (not shown in the figure), according to an embodiment of the invention; as described in detail in the following, the system 100 can be used, for example, as a probe card, as a socket of a board-in board, for interconnecting power chips, in multi-chip modules, or in the assembling of 3-dimensional packages).

The system 100 includes a circuitized substrate 105; typically, the substrate 105 consists of a (mono- or multi-layer) printed circuit board having insulating plates on which conductive tracks are formed. Multiple contact terminals 110 (for example, from a few tens to some thousands) project from a lower surface of the substrate 105 (denoted with 105m); each terminal 110 is used to connect a corresponding electrical contact of the electronic device to a specific conductive track of the substrate 105. It will be apparent to those skilled in the art that the terminals 110 have a size at the semiconductor technology level, which is completely incompatible with any mechanical process; for example, each terminal 110 has a base smaller than 1-2 mm$^2$ (typically of the order of a few thousands of μm$^2$) and a height lower than 1 mm (typically of the order of some tens or hundreds of μm).

In detail, an outer conductive film 115 defines the shape of the terminal 110 (as described in detail in the following). The layer 115 exhibits a very low resistance, so as to ensure a good electrical contact with the corresponding contact of the electronic device. For this purpose, the layer 110 is made of a material with a high conductivity (for example, gold or nickel), and for example with a thickness at least equal to 15 nm (such as 15-1000 nm).

In some applications, a further conductive layer 120 is arranged on top of the layer 115 (inside the terminal 110). The layer 120 is used to increase the stiffness and to reduce the resistance of the terminal 110. Typically, the layer 120 is made of a low-cost material (for example, nickel, titanium, aluminum, copper) and could have a thickness, for example, of 0.1-50 μm (such as 0.1-1 μm).

The layers 115,120 have a central lowered portion (defining a recess), which is surrounded by a flat frame. That recess accommodates a core 125 of the terminal 110. The core 125 defines the desired mechanical characteristics of the terminal 110 (especially its elasticity). The core 125 is made of a polymeric material, i.e., resulting from a polymerization process in which simple molecules, or monomers, are combined with a number of like or unlike molecules to form a polymer (for example, silicone-based). The core 125 can also be used to reduce the resistance of the terminal 110; for example, this result is achieved by embedding nano-balls 127 into the polymeric material (for example, with a diameter of 15-180 nm). In a specific embodiment of the invention, the nano-balls 127 are made of a conductive material (such as silver or gold); in addition or in alternative, the nano-balls 127 are made of a magnetic material (such as nickel, iron or ferrite).

Another conductive layer 130 is connected to the frame of the layer 120 (or of the layer 115 when the layer 120 is missing). The layer 130 seals the recess accommodating the core 125; at the same time, it ensures a good electrical contact with the layer 115. For this purpose, the layer 130 is made of a material with a high conductivity (for example, gold, silver, nickel, titanium or aluminum) and has a thickness, for example, of 0.1-50 μm (such as 0.1-1 μm).

A further conductive layer 135 is arranged on top of the layer 130. The layer 135 is used to facilitate the bonding of the terminal 110 to the substrate 105 (for example, by soldering to a gold layer). For this purpose, the layer 135 is preferably made of gold and has a thickness of about 100 nm. This layer 135 can be missing when the layer 130 is already made of gold.

Figure 2:
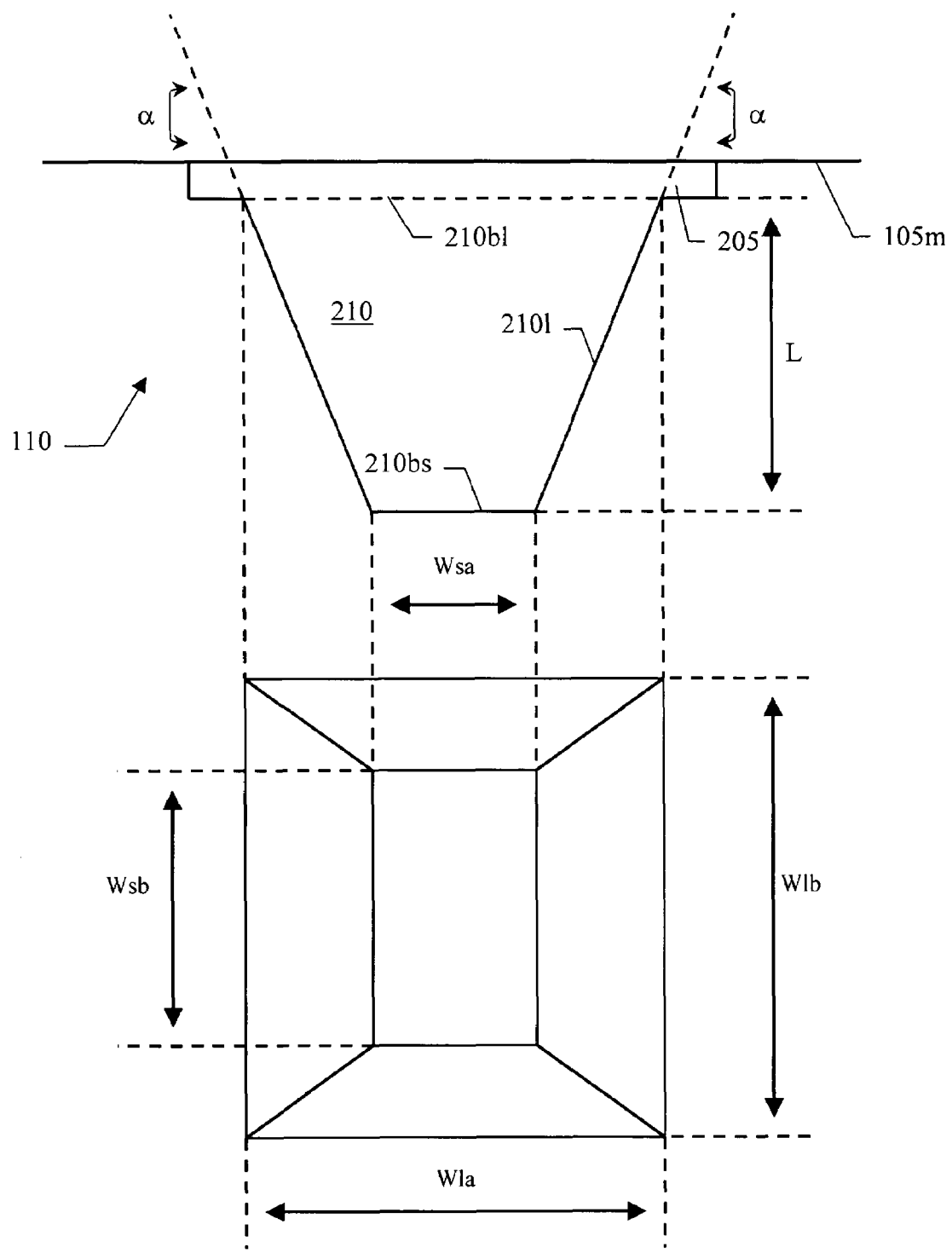
FIG. 2 is a side elevation view and a top view of a terminal according to an embodiment of the invention.

The shape of the above-describe terminal 110 (according to an embodiment of the invention) is illustrated in greater detail in FIGS. 2. Particularly, the figure shows the terminal 110 in a side elevation view and in a top view. As can be seen, the terminal 110 has a base 205 (on the main surface 105m of the substrate), from which a functional element 210 projects downwards. The functional element 210 consists of a frusto-pyramid (defining the trapezoidal profile shown in the figure). In the example at issue, the frusto-pyramid starts with a larger rectangular base 210bl (Wla×Wlb) on the base 205 and ends with a smaller rectangular base 210bs (Wsa×Wsb); the smaller base 210bs (which defines the portion of the terminal 110 actually contacting the corresponding element of the electronic device) is arranged at a height L from the larger base 210bl. A lateral surface 210l (consisting of four trapezoidal faces) extends from the larger base 210bl to the smaller base 210bs. The lateral surface 210l forms an angle α with the base 205 (and then with the main surface 105m of the substrate); the angle α ranges from 45° to 75°, and preferably from 50° and 70° (such as from 53° to 65°). The above-described values are defined by the following relation:

$$Wsa = Wla - \frac{2 \cdot L}{\tan(\alpha)} \quad (1)$$

Figure 3:
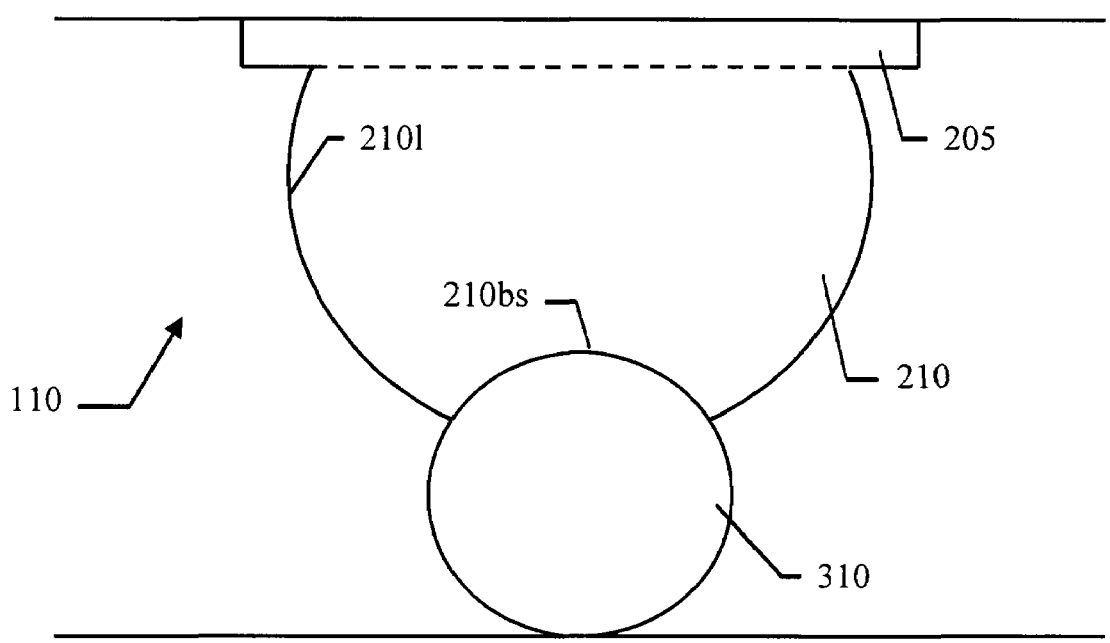
FIG. 3 depicts an exemplary application of the terminal of FIG. 2.

An exemplary application of this (frusto-pyramidal, or trapezoidal-profile) terminal 110 is illustrated in FIG. 3. In this example application, the trapezoidal-profile terminal 110 is used to connect an electrical contact consisting of a bump 310. In this case, the polymeric core of the terminal 110 has a high elasticity; for example, the core has a compression strain factor (defined as the maximum percentage deformation that can be sustained by the core in response to a compression stress before breaking or yielding) that is higher than 20%, for example, higher than 30% (such as between 40% and 90%). Advantageously, the structure defining the lateral surface 210 consists of a single metallic layer (so as not to increase its stiffness).

As can be seen, when the terminal 110 is pressed against the bump 310 the smaller base 210bs bends according to the profile of the bump 310 (with the lateral surface 210l that enlarges accordingly). As a result, the smaller base 210bs embraces the bump 310 so as to ensure a good electrical contact.

Figure 4A:
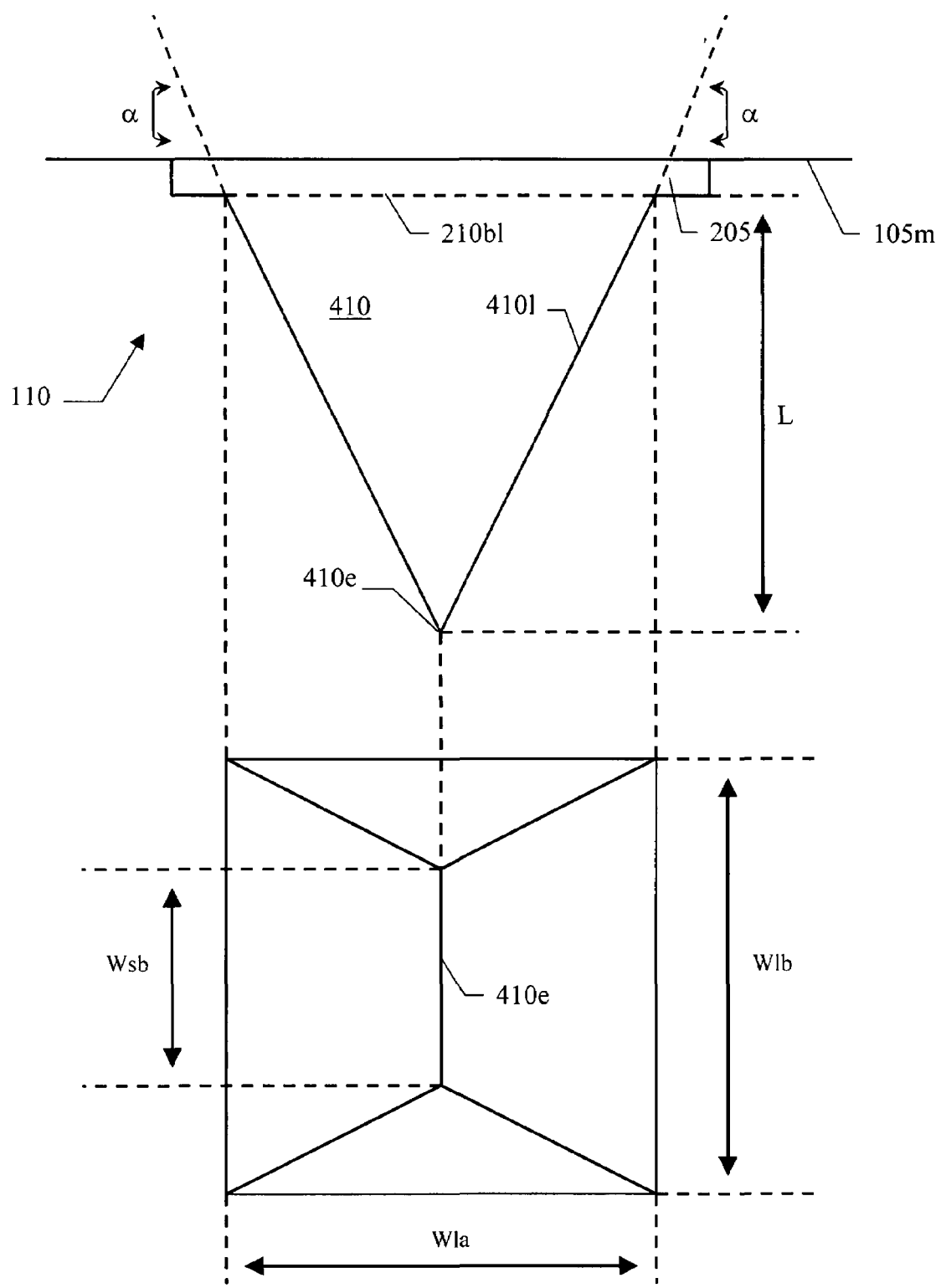
FIGS. 4a-4b are side elevation views and top views of the terminal according to other embodiments of the invention.

Considering now FIG. 4a, in another embodiment of the invention the terminal 110 has a functional element 410 (extending from the base 205 ), which ends with an edge 410e. More in detail, the function element 410 now consists of a polyhedron (defining the triangular profile shown in the figure), which has the same rectangular base 210bl (Wla×Wlb); a lateral surface 410l consists of two trapezoidal faces and two triangular faces that joint into the edge 410e (having a length Wsb). In other words, this shape (with Wsa=0) is obtained from the relation (1) when:

$$Wla = \frac{2 \cdot L}{\tan(\alpha)} \quad (2)$$

Figure 4B:
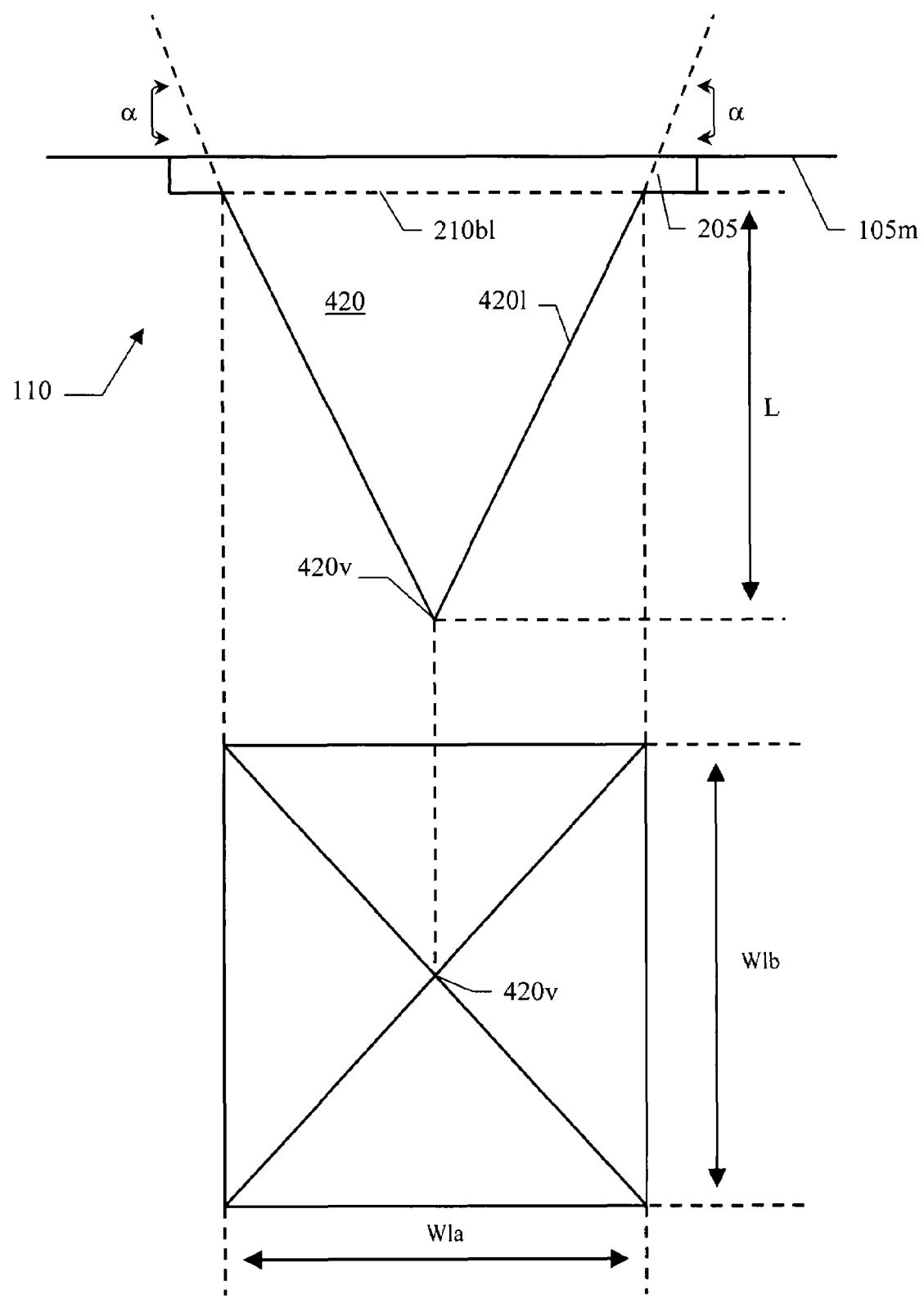

Alternatively, as shown in FIG. 4b, the terminal 110 has a functional element 420 that ends with a vertex 420v. In this case, the function element 420 consists of a pyramid (always with a triangular profile), which has the same rectangular base 210bl (Wla×Wlb); however, a lateral surface 420l is now formed by four triangular faces that joint into the vertex 420v. This shape is obtained from the relations (1) or (2) when both Wsa=0 and Wsb=0.

Figure 5:
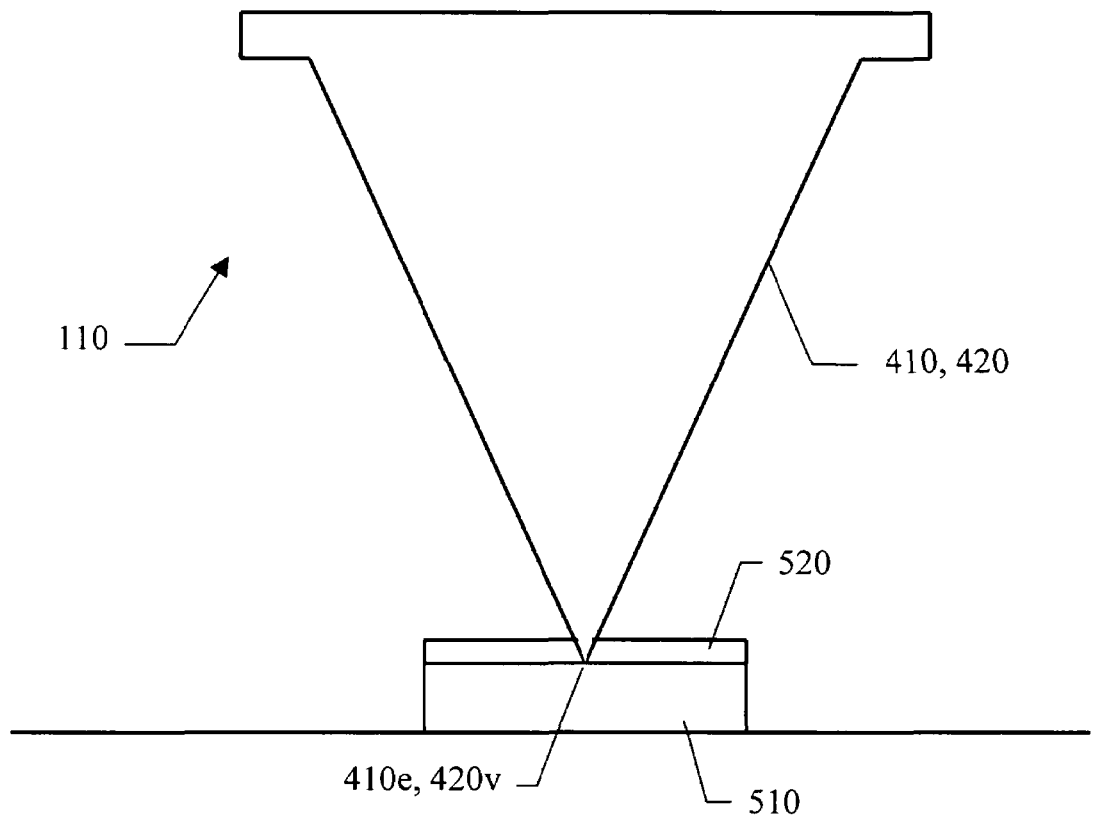
FIG. 5 depicts an exemplary application of the terminals of FIGS. 4a-4b.

An exemplary application of this (polyhedral/pyramidal, or triangular-profile) terminal 110 is illustrated in FIG. 5. In this example, the triangular-profile terminal 110 is used to connect an electrical contact consisting of a pad 510; typically, the pad 510 is covered by a film of native oxide 520 (for example, with a thickness of about 5-8 nm). In this case, the polymeric core of the terminal 110 has a lower elasticity; for example, the compression strain factor of the core is lower than 50%, for example, lower than 40% (such as between 3% and 30%). Advantageously, the structure defining the lateral surface 410 or 420 consists of a double metallic layer (so as to increase its stiffness).

As can be seen, when the terminal 110 is pressed against the pad 510 the edge 410e or the vertex 420v scrubs the native oxide layer 520 (thanks to their shape and stiffness). As a result, the edge 410e or the vertex 420v ensures a good electrical contact with the pad 510.

The various stages of a process (according to an embodiment of the invention) of manufacturing the above-described system (with the terminals having a fixed slope of their lateral surfaces) are shown in the FIGS. 6a-6i.

Figure 6A:
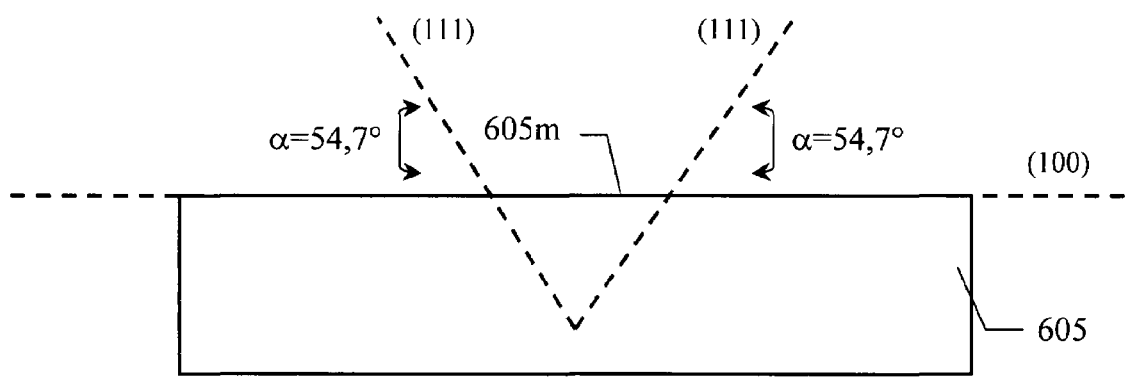
FIGS. 6a-6i show the various stages of a process of manufacturing the system according to an embodiment of the invention.

Considering in particular FIG. 6a, the process exploits a sacrificial wafer of semiconductor material 605 (typically with a thickness of some mm). The wafer 605 has been cut so as to expose a crystal plane providing a high etching rate. In the example at issue, an exposed working surface 605m of the wafer 605 has a crystallographic orientation defined by the Miller index <100>; the etching rate along a direction perpendicular to this crystal plane (100), i.e., vertical in the figure, is in the range from a few hundreds of nm to a few μm per minute (depending on the chemical solution, its concentration and the temperature). In this case, a crystal plane (111) forms an angle α=54.7° with the working surface 605m. The crystal plane (111) exhibits a far lower etching rate, about 400 times lower than the one of the crystal plane (100), so that its facets act as a stop layer. The wafer 605 can be of any type; however, when the wafer 605 is of the P-type it is necessary to ensure a concentration of impurities lower than $5 \cdot 10^{18}$ atoms/cm$^3$ (since a higher concentration of impurities would stop the etching).

Figure 6B:
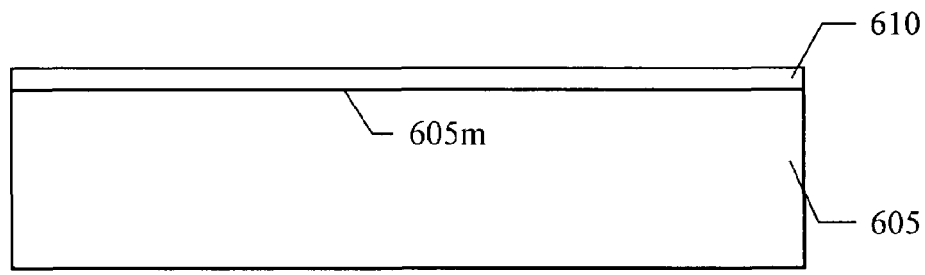

Passing to FIG. 6b, the working surface 605m is covered with a protection layer 610 (for example, made of silicon nitride $Si_3N_4$ or silicon oxide $SiO_2$). The protection layer 610 is then selectively etched (such as with a plasma or RIE process) through corresponding openings that are made in a photo-resist layer (not shown in the figure) with a standard photolithographic process.

Figure 6C:
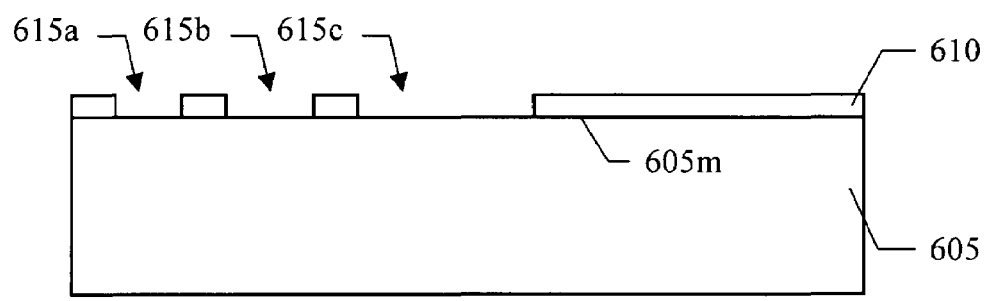

Therefore, as shown in FIG. 6c, the layer 610 defines a mask that leaves desired portions of the working surface 605m exposed. In the example at issue, three (rectangular) windows 615a, 615b and 615c are opened in the protection layer 610. The shape and the size of the windows 615a-615c are chosen according to the desired configuration of the terminals (as will be apparent in the following).

Figure 6D:
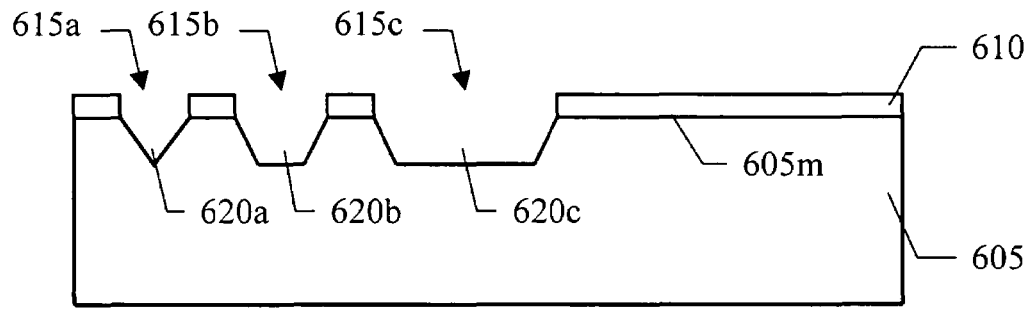

With reference now to FIG. 6d, the wafer 605 is wet etched (by means of a suitable chemical solution). The etching acts through the windows 615a-615c only. The process is relatively fast until the crystal plane (111) is encountered (after that the etching rate can be deemed negligible). Therefore, the process results in grooves 620a, 620b and 620c (corresponding to the desired terminals) for the windows 615a, 615b and 615c, respectively; the grooves 620a-620c have lateral surfaces that extend at the angle α from the working surface 605m, and (rectangular) bottoms that get smaller and smaller as the etching proceeds. Particularly, when only facets of the crystal plane (111) remain exposed (as in the smallest groove 620a), the corresponding base collapses into an edge (if the window 615a is a rectangle) or a vertex (if the window 615a is a square), so as to obtain a triangular profile. The depth of the groove 620a depends on the size of the corresponding window 615a; for example, a groove 620a with a depth of 15 µm requires a width of the window 615a that is given by the relation (2):

$$Wla = \frac{2 \cdot L}{\tan(\alpha)} = \frac{2 \cdot 15 \cdot 10^{-6}}{\tan(54.7)} = \frac{2 \cdot 15 \cdot 10^{-6}}{1.41} = 21.28 \cdot 10^{-6} = 21.28 \ \mu m$$

The time required to achieve this result depends on the etching rate; for example, assuming an etching rate of 1 µm/minute, the desired shape is obtained after 15 minutes.

Figure 6E:
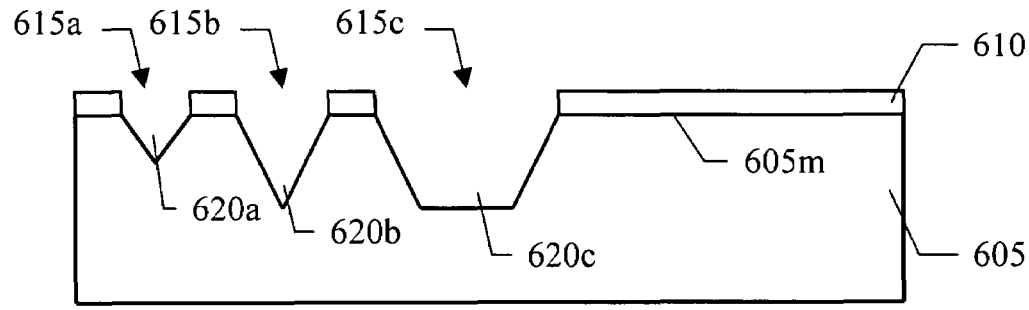
Figure 6F:
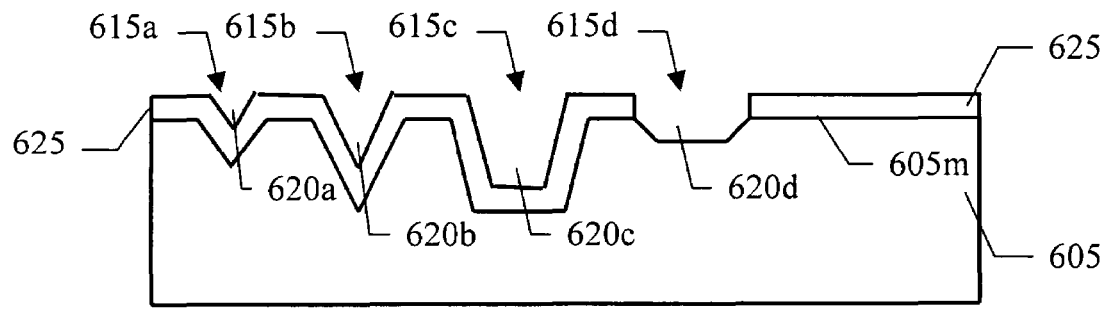

If the etching process continues, as shown in FIG. 6e, the shape of the (triangular-profile) groove 615a remains substantially unchanged, since the etching rate can be deemed negligible on the facets of the crystal plane (111). Conversely, the depth of the grooves 615b, 615c increases (while their bottoms get smaller and smaller). Even in this case, when only facets of the crystal plane (111) remain exposed (as in the intermediate groove 620b) a triangular profile is obtained. As can be seen, the groove 620b is deeper than the groove 615a (since its window 615b is larger than the window 615a is); for example, assuming that the window 615b has a width of 30 µm we obtain that the depth of the groove 620b is:

$$L = \frac{Wla \cdot \tan(\alpha)}{2}$$
$$= \frac{30 \cdot 10^{-6} \cdot \tan(54.7)}{2}$$
$$= \frac{30 \cdot 10^{-6} \cdot 1.41}{2}$$
$$= 21.15 \cdot 10^{-6}$$
$$= 21.15 \ \mu m$$

This result is achieved (with the same etching rate of 1 µm/minute) after 21.15 minutes. At the same time, the biggest window 615c provides a groove 620c with the same depth (L=21.15 µm) but with a trapezoidal profile; for example, if the window 615c has a width of 50 µm, from the relation (1) we obtain that the width of its bottom is:

$$Wsa = Wla - \frac{2 \cdot L}{\tan(\alpha)}$$
$$= 50 \cdot 10^{-6} - \frac{2 \cdot 21.15 \cdot 10^{-6}}{\tan(54.7)}$$
$$= \left(50 - \frac{42.30}{1.41}\right) \cdot 10^{-6}$$
$$= 20 \cdot 10^{-6}$$
$$= 20 \ \mu m$$

The protection layer 610 is now removed (for example, through an etching process in a hydrofluoric acid solution).

Therefore, by defining the width of the windows and controlling the duration of the etching process, it is possible to obtain grooves with the desired depth and any trapezoidal profile; at the same time, it is also possible to obtain other grooves with a triangular profile that are less deep. It should be noted that the difference in the depth of the grooves can even be very high without substantially impairing the accuracy of the structure. For example, let us consider a small groove with a depth of 50 µm (obtained after 50 minutes) and a big groove with a depth of 410 µm (obtained after 410 minutes). In this case, assuming an etching rate of 2.5 nm/minute for the crystal plane (111), the time required for obtaining the big groove after completion of the small one (i.e., 410−50=360 minutes) increases the depth of the small groove by:

$$\triangleleft L=360 \cdot 2.5 \cdot 10^{-9}=900 \cdot 10^{-9}=0.9 \ \mu m$$

This value represents a negligible percentage of the depth of the small groove, and exactly:

$$L\% = \frac{\Delta L}{L} \cdot 100 = \frac{0.9 \cdot 10^{-6}}{50 \cdot 10^{-6}} \cdot 100 = 0.018 \cdot 100 = 1.8\%$$

(which is totally compensated by the elasticity of the resulting terminal).

Whenever grooves (for the corresponding terminals) with trapezoidal profile but different depth are required, the same operations described above are repeated with other windows and/or duration of the etching process. Considering in particular FIG. 6f, once a first set of grooves has been obtained (i.e., the grooves 620a-620c), the whole wafer 605 is covered with a further protection layer 625. The protection layer 625 is selectively removed to define another mask with the desired windows (for example, the window 615d in the example at issue). The wafer 605 is now wet etched through the window 615d, so as to obtain a corresponding groove 620d. For example, if the etching process (with the same rate of 1 µm/minute) has a duration of 10 minutes the groove 620d will have a depth L=10 µm; in this case, assuming that the window 615d has a width of 40 µm we obtain that the width of its bottom is:

$$Wsa = Wla - \frac{2 \cdot L}{\tan(\alpha)}$$
$$= 40 \cdot 10^{-6} - \frac{2 \cdot 21.15 \cdot 10^{-6}}{\tan(54.7)}$$
$$= \left(40 - \frac{42.30}{1.41}\right) \cdot 10^{-6}$$
$$= 10 \cdot 10^{-6}$$
$$= 10 \ \mu m$$

The protection layer 625 is then removed as in the preceding case. The same process can be reiterated once or more times according to the desired configuration of the grooves (and then of the corresponding terminals).

Figure 6G:
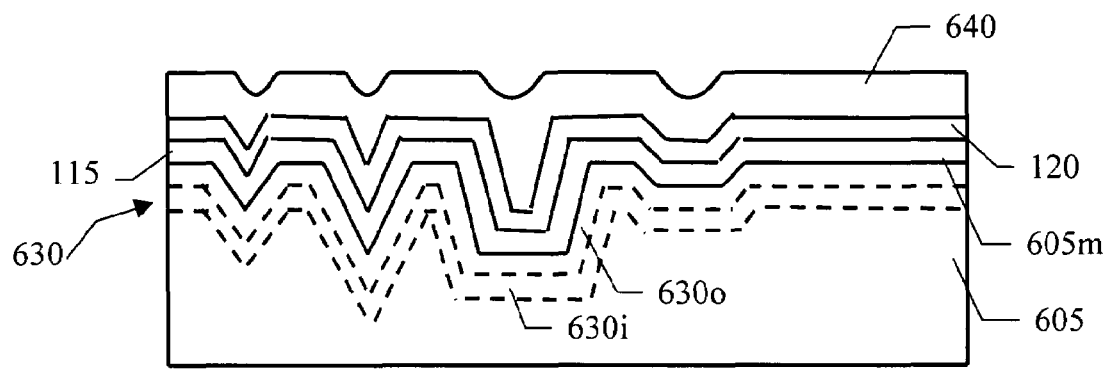

With reference now to FIG. 6g, the wafer 605 is subjected to an anodic process. Particularly, the wafer 605 is used as an anode in an electrochemical cell (having an electrolyte rich of Hydrofluoric acid, or HF). When the current density of the anodic process is lower than a critical value $J_{PS}$ (depending on multiple experimental factors), the electrolyte only reacts with the holes that reach the working surface 605m (so that the reaction is limited by the feeding of the holes and not by their ionic diffusion into the electrolyte). Of course, this requires the availability of (free) holes on the working surface 605m. The availability of holes when the wafer 605 is of the P-type is obvious. Conversely, when the wafer is of the N-type the interface silicon-electrolyte acts as a reverse-biased Schottkly junction (i.e., with a depletion region which width decreases as the concentration of impurities of the wafer 605 increases). Therefore, when the wafer 605 has a high concentration of impurities (N+) the free holes in the wafer 605 can pass through the potential barrier of this junction by quantum-mechanical tunneling; conversely, it is necessary to provide energy to the holes for allowing their passage through the potential barrier (for example, by lightening the working surface 605m).

The above-described process results in the formation of a layer of porous silicon (PS) 630 extending from the working surface 605m into the wafer 605. The porous silicon has a complex structure with a random network of small pores. The characteristics of the porous silicon depend on its morphology, which in turn is a function of different process parameters (for example, the concentration and the type of impurities of the wafer, the current density, the type and concentration of the electrolyte, the duration of the process, and the like). In the context of an embodiment of the present invention, the characteristics of the porous silicon that are exploited are the mechanical ones that strongly depend on its porosity. The porosity of the silicon (P %) is defined in percentage as:

$$P\% = \left(1 - \frac{\rho_{PS}}{\rho_{Si}}\right)\%$$

where $\rho_{PS}$ is the density of the porous silicon and $\rho_{Si}$ is the density of the crystalline silicon (2.3 g/cm$^3$). The density of the porous silicon $\rho_{PS}$ can be measured by applying the following formula:

$$\rho_{PS} = \rho_{Si} - \frac{P_s - P_e}{S \cdot d}$$

where the values $P_s$ (initial weight of the wafer before the anodic process), $P_e$ (ending weight of the wafer after the anodic process) and d (width of the porous silicon layer) can be measured, while the value S (area of the exposed surface of the wafer) is known.

In an embodiment, the porous silicon layer 630 has a width of about 1-200 μm. Advantageously, the porous silicon layer 630 consists of an outer layer 630o (for example, with a width from 0.1 to 10 μm) that has a relatively low porosity (such as lower than 40%, and preferably from 10% to 30%), so as to ensure a good uniformity of the next deposition processes; on the other hand, an inner layer 630i (for example, with a width from 1 to 200 μm) has a higher porosity (such as higher than 50%, for example, from 60% to 85%), so as to facilitate its peeling at the end of the process. For example, this result can be achieved starting from a wafer of the N+ type with a crystallographic orientation <100>, which is immersed into an electrolyte as HF (50%)—$C_2H_5OH$ (1:3 in volume); the anodic process is performed at room temperature, by applying a current density of 150 mA/cm$^2$.

The metallic layer 115 and the metallic layer 120 (when it is necessary) are then deposited onto the wafer 605. The grooves 620a-620d (covered with the metallic layers 115,120) are then filled with a layer of polymeric material 640; several techniques can be used for this purpose (such as spinning, dipping, spraying, or stencil printing processes).

The polymeric layer 640 is now subjected to a planarization process; for example, the process is carried out with a dry etching (such as of the RIE or plasma type), a Chemical Mechanical Polishing (CMP), a wet etching, or by exposing the wafer 605 to the light (when the polymeric material is photosensitive); in the latest case, the desired result can be achieved regulating the intensity of a lighting source or using a gray mask (with a fixed light intensity).

Figure 6H:
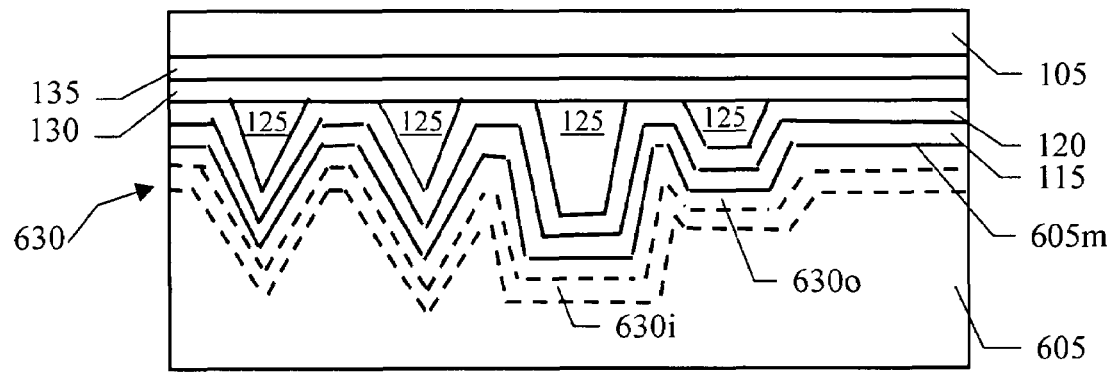
Figure 6I:
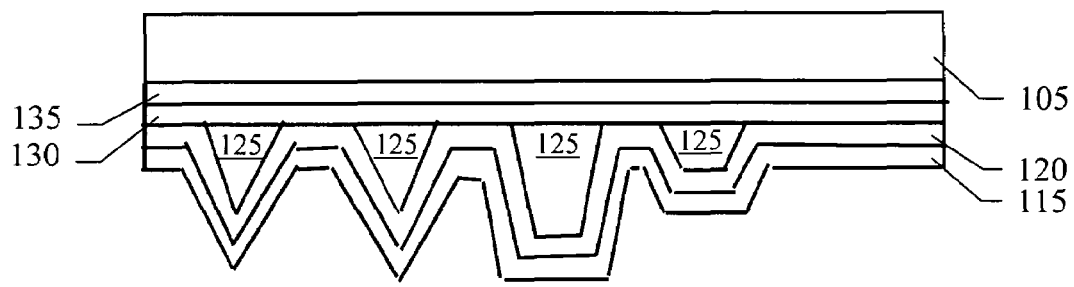

Therefore, as shown in FIG. 6h, the polymeric material remains only inside the grooves 620a-620d, thereby defining the cores 125 of the desired terminals. The metallic layer 130 and the metallic layer 135 (when it is necessary) are then deposited onto the wafer 605. The different components of the substrate 105 can now be formed on top of the metallic layer 135. Alternatively, the substrate 105 is directly bonded onto the metallic layer 135 (when it has been manufactured separately). The wafer 605 is now removed with a peeling technique (by exploiting the mechanical fragility of the porous silicon layer 630). In this way, it is obtained the desired structure shown in FIG. 6i (corresponding to the one described above with reference to FIG. 1).

This process allows obtaining trapezoidal-profile grooves of any depth (and then corresponding terminals of any height) by controlling the duration of the etching process. However, the same result can be achieved even with alternative techniques that are independent of the duration of the etching process.

Figure 7A:
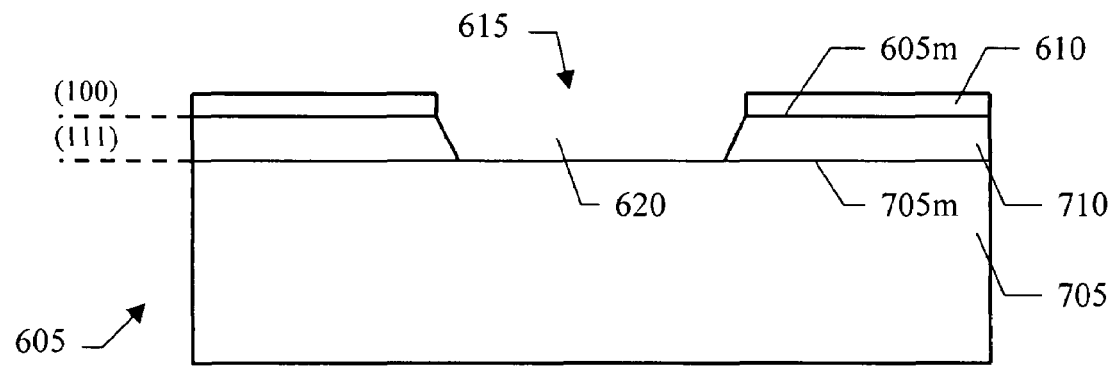
FIGS. 7a-7d illustrate different processes of manufacturing the system according to alternative embodiments of the invention.

A first example is illustrated in FIG. 7a (in the following, the elements corresponding to the ones shown in the preceding figures are denoted with the same references, and their explanation will be omitted for the sake of brevity). In this case, the sacrificial wafer 605 has a composite structure that is formed by a wafer 705 and a wafer 710 (which is bonded on top of the wafer 705). A main surface 705m of the wafer 705 (facing the wafer 710) has the crystallographic orientation <111>. Conversely (as in the above-described process), an exposed surface of the wafer 710 being opposed to the wafer 705 (which defines the working surface 605m) has the crystallographic orientation <100>. The wafers 705 and 710 can be of any type, provided that the wafer 710 has a concentration of impurities lower than $5 \cdot 10^{18}$ atoms/cm$^3$ when of the P-type (so as to allow the etching). In this case, the etching process substantially stops as soon as the wafer 705 is encountered. Therefore, the depth of any trapezoidal-profile groove that is obtained through a corresponding window opened in the protection layer 610 (generically denoted in the figure with 620 and 615, respectively) is at most equal to the thickness of the wafer 710; as a result, the depth of the groove 620 (and then the height of the corresponding terminal) can be defined with a very high accuracy by controlling the thickness of the wafer 710 (for example, through a polishing process). Of course, even in this case it is possible to obtain additional shallow grooves with either a triangular profile (by using smaller windows) or a trapezoidal profile (by using shorter etching processes). The production of the terminals then continues exactly with the same steps described above.

Figure 7B:
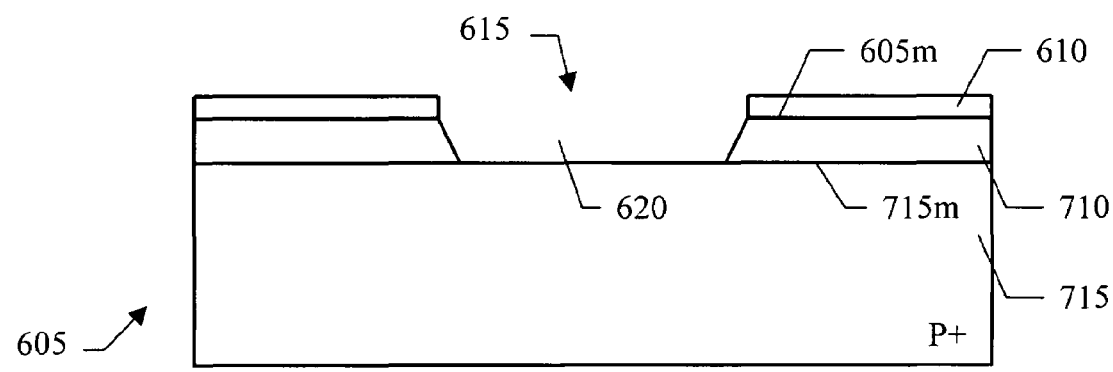

Alternatively, as shown in FIG. 7b, the same result is achieved by bonding the wafer 710 on a main surface 715m of a wafer 715 of the P+ type (irrespective of its crystallographic orientation); particularly, the wafer 715 has a concentration of impurities higher than $5 \cdot 10^{18}$ atoms/cm$^3$ so as to act as a stop layer for the etching process.

Figure 7C:
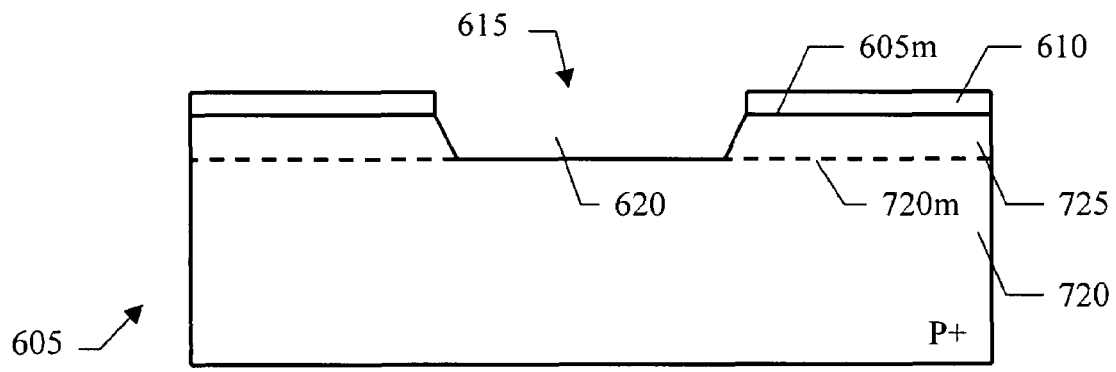

Another embodiment is based on the epitaxial process. With reference in particular to FIG. 7c, the sacrificial wafer 605 is obtained from a substrate 720 having the crystallographic orientation <100>; the substrate 720 is strongly doped with impurities of the P-type (i.e., with a concentration higher than $5·10^8$ atoms/cm$^3$). An epitaxial layer 725 is then grown on a main surface 720m of the substrate 720. The epitaxial layer 725 necessary has the same crystallographic orientation <100> of the substrate 720; however, the epitaxial process is controlled so as to obtain a far lower concentration of impurities, and in any case lower than $5·10^{18}$ atoms/cm$^3$. Therefore, even in this case the substrate 720 will act as a stop layer for the etching process. This technique allows controlling the thickness of the epitaxial layer 725 (and then of the terminals) with a far higher accuracy.

Figure 7D:
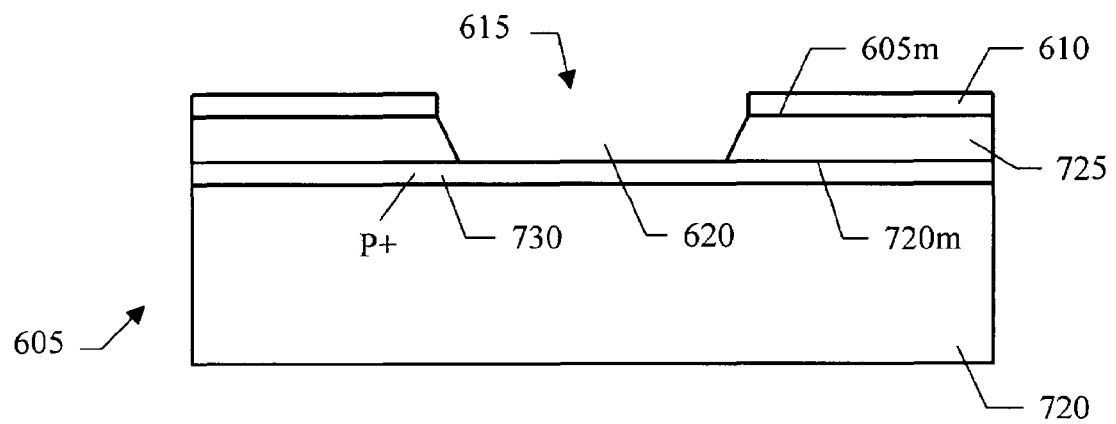

In addition, as shown in FIG. 7d, the same result can also be achieved (irrespective of the type of the substrate 720) by providing a dedicated stop layer 730 that extends inside the substrate 720 from its main surface 720m; for this purpose, the layer 730 must have a high concentration of impurities of the P-type (>$5·10^{18}$ atoms/cm$^3$). For example, the layer 730 can be obtained by means of an ion implantation or a diffusion process.

Figure 8A:
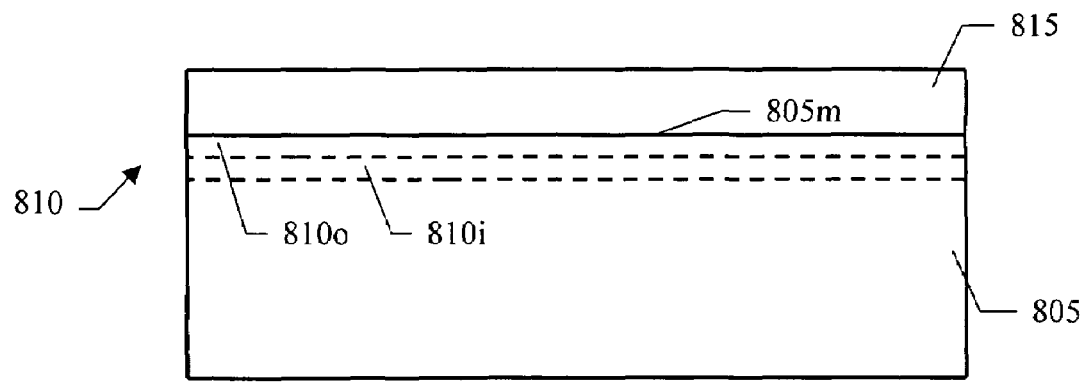
FIGS. 8a-8b show the various stages of a process of manufacturing the system according to a different embodiment of the invention.
Figure 8B:
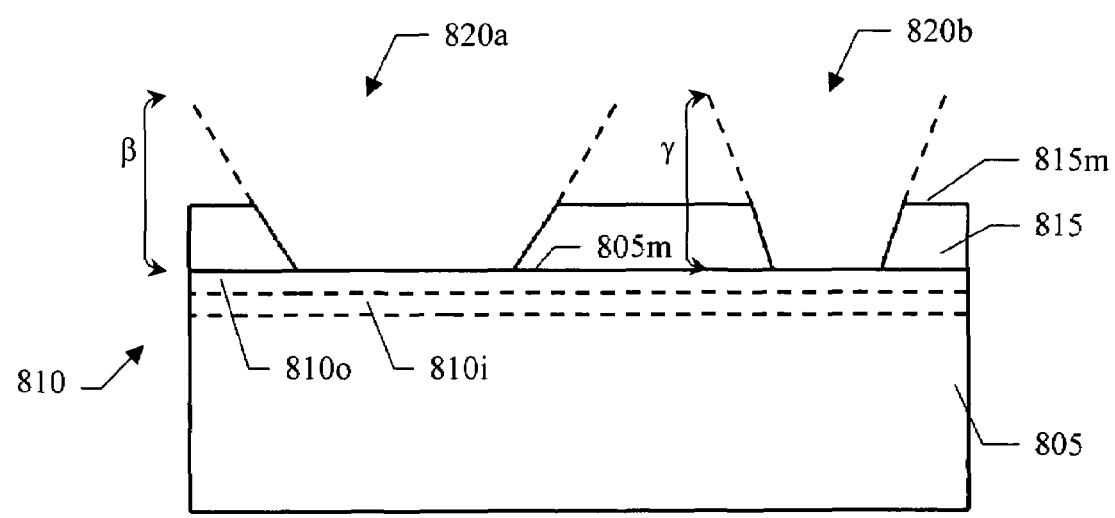

The various stages of a different process (according to an embodiment of the invention) of manufacturing the above-described system (with terminals having a variable slope of their lateral surfaces) are shown in the FIGS. 8a-8b.

Considering in particular FIG. 8a, the process exploits a sacrificial wafer of semiconductor material 805. The wafer 805 is then subjected to an anodic process (similar to the one described above), so as to form a layer of porous silicon 810 that extends from an (exposed) working surface 805m of the wafer 805. Even in his case, the porous silicon layer 810 has a width of about 1-200 μm, and advantageously includes an outer layer 810o with a lower porosity (for example, from 10% to 40%) and an inner layer 810i with a higher porosity (for example, from 50% to 85%). A (positive or negative) photoresist layer 815 is then deposited onto the working surface 805m of the wafer 805. The photoresist layer 815 has a thickness higher than the desired heights of the terminals (for example, of the order of hundreds of μm).

Moving now to FIG. 8b, the photoresist layer 815 is exposed in selected regions; in each region, the intensity of the exposure decreases or increases moving toward its central area (for example, using a gray mask). As a result, the structure illustrated in the figure is obtained when portions of the photoresist layer 815 (i.e., the exposed ones for the positive type or the non-exposed ones for the negative type) are dissolved in a development solution. Particularly, the photoresist layer 815 exhibits grooves 820a, 820b that extend from an exposed surface 815m of the photoresist layer 815 towards the wafer 805. The grooves 820a, 820b can have either a triangular or a trapezoidal profile, and they can reach or not the wafer 805 (according to the definition of the gray mask and the exposure process). Moreover, the grooves 820a and 820b have lateral surfaces that form an angle β and γ, respectively, with the exposed surface 815m. The angles β,γ can take any value up to 90° (according to the gray mask); in any case, the angles β,γ are preferably in the range from 45° to 75°. Even in this embodiment of the invention, it is possible to obtain additional grooves with different profiles and/or depth by repeating the same operations with other gray masks and durations of the exposure process. The production of the terminals then continues exactly with the same steps described above.

Figure 9:
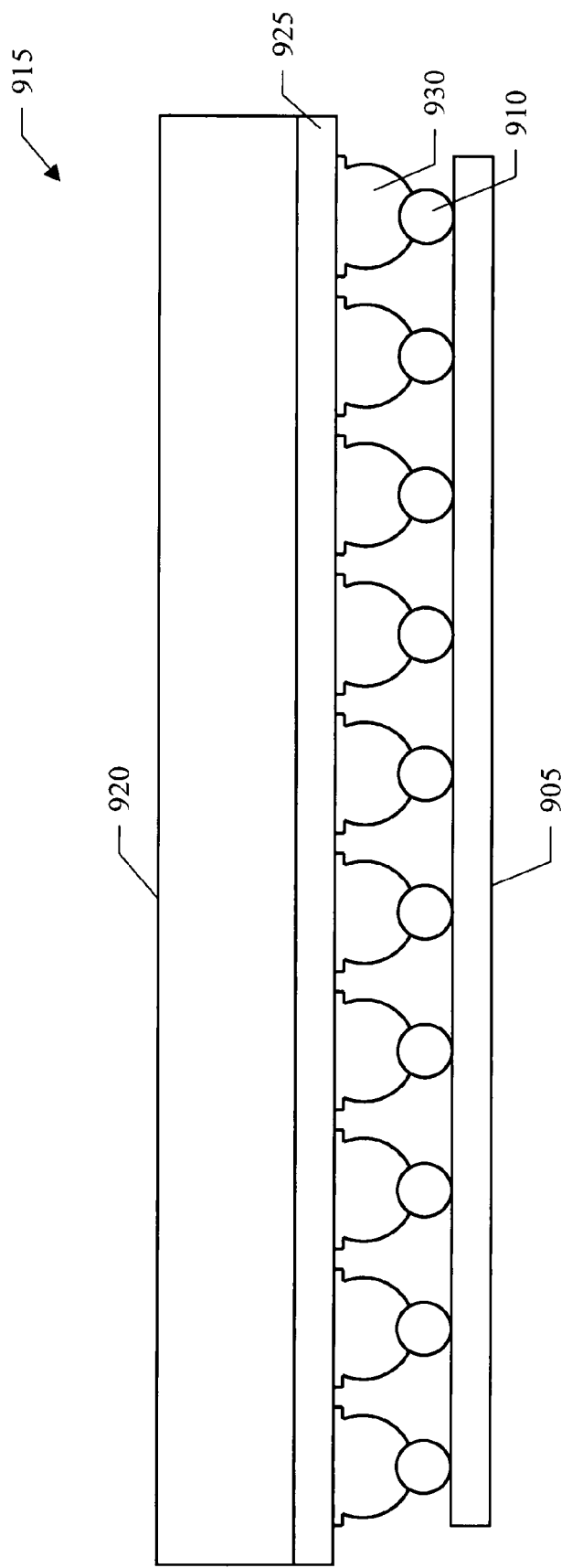
FIG. 9 is a pictorial representation of a probe card according to an embodiment of the invention.

An exemplary application of the solution according to an embodiment of the invention is illustrated schematically in FIG. 9. Particularly, the figure shows a system 900 that is used to verify operation of integrated circuits in a wafer 905 (for example, during a burn-in test). The wafer 905 is provided with an array of electrical contacts 910 (in the form of bumps in the example at issue).

A probe card 915 is used to test the integrated circuits of the wafer 905 during the burn-in process. The probe card 915 is based on a printed circuit board 920 (for routing the desired signals). A compliant interposer 925 is used to compensate any warp of the wafer 905. A matrix of terminals 930 (with the trapezoidal profile) are then arranged on the complaint interposer 925. During the burn-in test, the terminals 930 can contact all the bumps 910 simultaneously, or they can be used to contact sets of bumps 910 in succession. In any case, the terminals 930 allow compensating the non-homogeneity of the bumps 910 individually.

Figure 10:
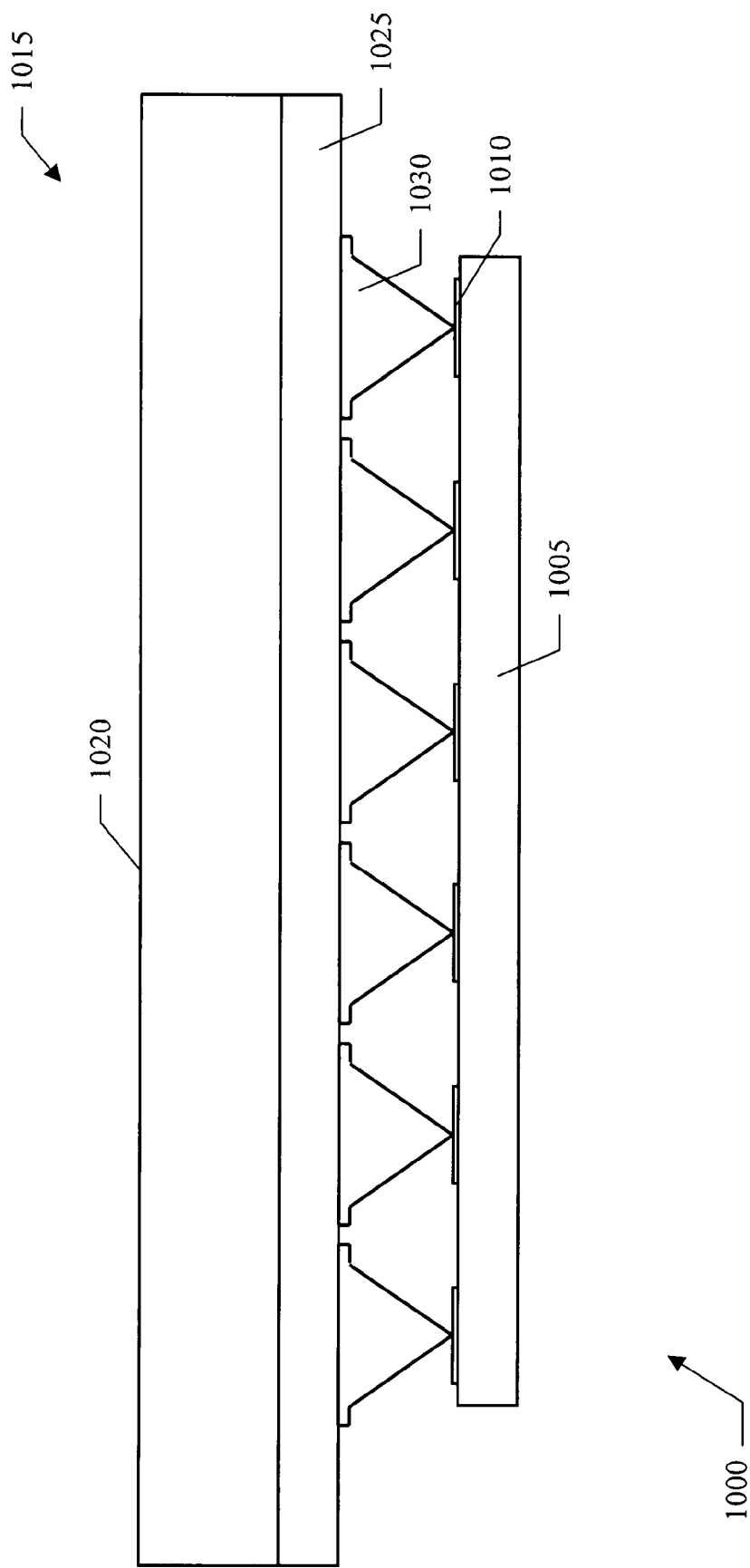
FIG. 10 is a pictorial representation of a probe card according to another embodiment of the invention.

Another exemplary application of the solution according to an embodiment of the invention is illustrated schematically in FIG. 10. Particularly, the figure shows a system 1000 that is used to test integrated circuits in a wafer 1005; the wafer 1005 is now provided with an array of electrical contacts 1010 in the form of pads. A probe card 1015 is likewise formed by a printed circuit board 1020, a compliant interposer 1025, and a matrix of terminals 1030; in this case, however, the terminals 1030 have the triangular profile.

It should be noted that a portion of the structures described above (with reference to either FIG. 9 or FIG. 10) can also be used to implement sockets of a burn-in board. The sockets are used for testing packages (each one embedding one or more chips); particularly, they hold in place and electrically connect the packages to simulation circuits of the burn-in board for the time needed to execute the test. Of course, the applicability of the proposed terminals for contacting the chips at the package level derives from their applicability at the wafer level (since the functional requirements in the first case are far less relaxed with respect to the second one).

Figure 11:
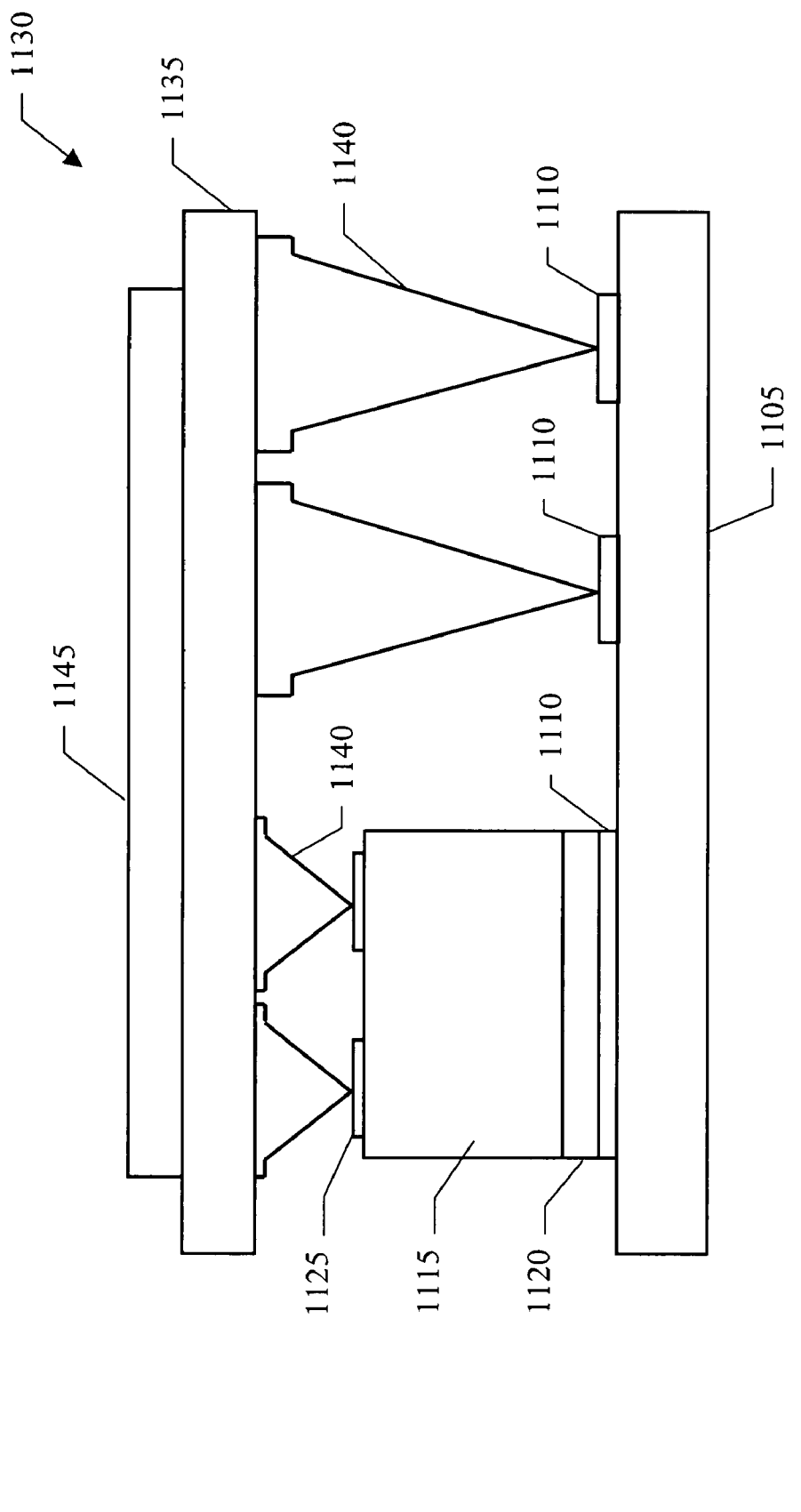
FIG. 11 is a pictorial representation of an electronic assembly for interconnecting power chips according to an embodiment of the invention.

A different exemplary application of the solution according to an embodiment of the invention is illustrated schematically in FIG. 11. Particularly, the figure shows a power electronic assembly 1100. The assembly 1100 includes an insulating substrate 1105 on which conductive tracks 1110 are formed. One or more power chips 1115 are mounted on selected tracks 1110 by means of a solder past 1120 (through a pick-and-place process). Different examples of materials that can be used for the substrate 1150 and the tracks 1110 (conductor) are given in the following table with their main properties:

| Parameter (typical) | Thin-film | Thick-film Standard | Thick-film Thick-Cu | Electroplating |
|---|---|---|---|---|
| Substrate material | Al2O3 Si | Al2O3 | Al2O3 | Al2O3 |
| Conductor | Cu, AgAu, Al | Ag, AgPd, Au + glas-comp. | Cu + glas | pure Cu |
| Conductor-thickness | <1 μm | 15 . . . 20 μm | 15 . . . 100 μm | 20 . . . 200 μm |
| Conductivity (Factor) | <1× | 1× | 2× | 5× |

-continued

| Parameter (typical) | Thin-film | Thick-film Standard | Thick-film Thick-Cu | Electroplating |
|---|---|---|---|---|
| Thermal conductivity W/mK | 24 | 24 | 24 | 24 |
| Expansion coefficient ppm/K | 7.1 4.0 (Si) | 7.1 | 7.1 | 7.1 |
| Line resolution (typical) | <10 µm | <200 µm | <500 µm | <100 µm |
| Current carrying capacity (Conductor heating) | very low | Low | medium | high |
| Environmental behavior | very good | very good | very good | very good |

| Parameter (typical) | DCB | DCB | AMB | IMS | PCB |
|---|---|---|---|---|---|
| Substrate material | Al2O3, AlN | BeO | AlN | Al, Polymer | Organic |
| Conductor | pure Cu | pure Cu | pure Cu | pure Cu | pure Cu |
| Conductor-thickness | 200 . . . 600 µm | 200 . . . 400 µm | 200 . . . 300 µm | 35 . . . 140 µm | 35 . . . 300 µm |
| Conductivity (Factor) | 5× | 5× | 5× | 5× | 5× |
| Thermal conductivity W/mK | 24 180(AlN) | 250 | 180 | 1-2 | <1 |
| Expansion coefficient ppm/K | 7.1 4.1 (AlN) | 8.5 | 4.1 | 100 | >30 |
| Line resolution (typical) | <600 µm | 800 µm | 800 µm | 100 . . . 500 µm | <100 µm |
| Current carrying capacity (Conductor heating) | very high +17° C./100 A | very high | very high | high | medium |
| Environmental behavior | very good | major issues | very good | fair | fair |

Electrical contacts 1125 of the power chips 1115 (in the form of pads in the example at issue) are coupled with the tracks 1110 by means of an interconnection element 1130. The interconnection element 1130 has the above-described structure, with a circuitized substrate 1135 having a matrix of terminals 1140, which are coupled with the tracks 1110 and the pads 1125. The terminals 1140 have multiple heights, so as to compensate the difference in level between the tracks 1110 and the pads 1125. Typically, this difference in level can be of the order of some hundreds of µm. However, as described in the foregoing, the terminals 1140 can reach a height up to some mm (corresponding to the thickness of the sacrificial wafer); in any case, differences in their heights of several hundreds of µm can be achieved with an accuracy of 1-5% (which is completely compensated by the elasticity of the terminals 1140).

Preferably, the interconnection element 1130 also includes driving circuits 1145 for the power chips 1115. In this case, the driving circuits 1145 are mounted on top of the substrate 1135 (opposite the terminals 1140); for this purpose, the substrate 1135 is provided with a printed circuit on its upper surface (not shown in the figure). This results in a 3-dimensional stack that provides a high compactness of the assembly 1100. The structure so obtained is typically embedded into a package (not shown in the figure).

Figure 12:
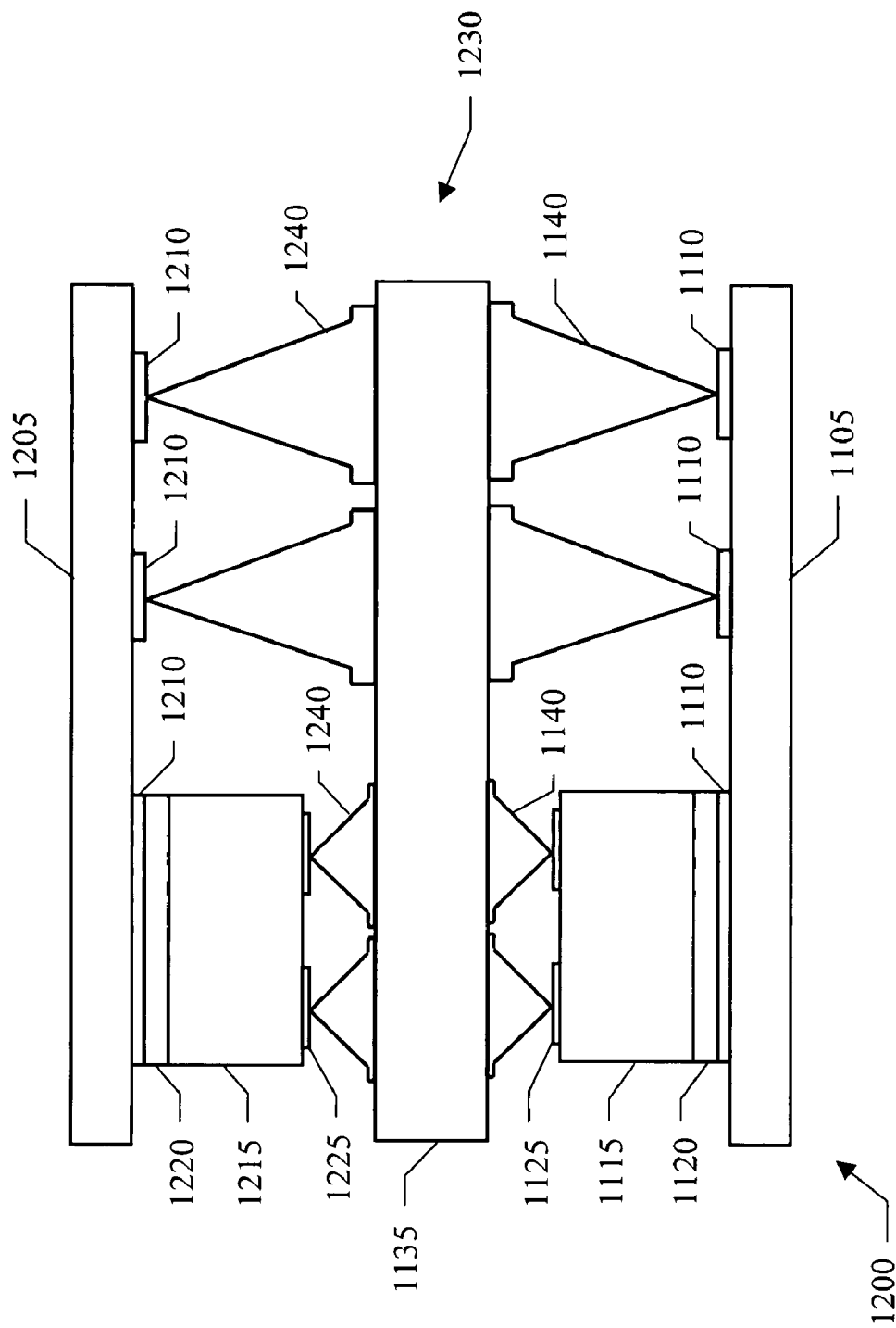
FIG. 12 is a pictorial representation of an electronic assembly for interconnecting power chips with a 3-dimensional structure according to another embodiment of the invention.

In addition, as shown in FIG. 12, in another exemplary application of the solution according to an embodiment of the invention a 3-dimensional power assembly 1200 is obtained. The assembly 1200 now includes a further insulating substrate 1205 with conductive tracks 1210, on which power chips 1215 with pads 1225 are mounted (by means of a solder past 1220). In this case, a double-face interconnection element 1230 is provided. Particularly, the interconnection element 1230 has a further matrix of terminals 1240 (with multiple heights) that project from the substrate 1135 (opposite the terminals 1140). The terminals 1240 likewise connect the electrical contacts 1225 of the power chips 1215 to the tracks 1210.

Figure 13:
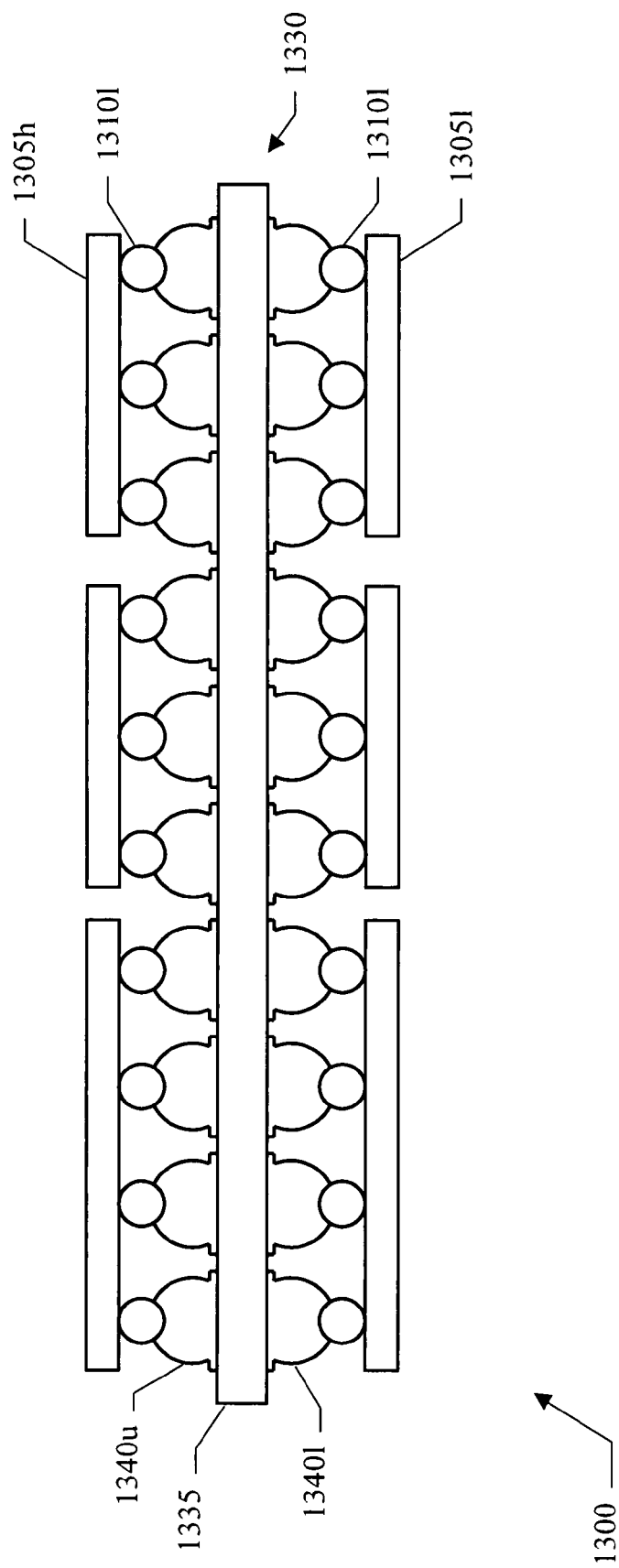
FIG. 13 is an exemplary multi-chip module with a 3-dimensional structure according to an embodiment of the invention.

With reference now to FIG. 13, an exemplary multi-chip module 1300 with a 3-dimensional structure (according to an embodiment of the invention) is illustrated. The multi-chip module 1300 is used to assemble one or more lower chips 1305*l* and one or more upper chips 1305*u*, each one provided with a plurality of electrical contacts 1310*l* and 1310*u*, respectively (in the form of bumps in the example at issue). The chips 1305*l*,1305*u* are coupled to each other by means of a double-face interconnection element 1330. The interconnection element 1330 has the above-described structure, with a circuitized substrate 1335 having a matrix of lower terminals 1340*l* and a matrix of upper terminals 1340*u* (with the trapezoidal profile in the example at issue). The lower terminals 1340*l* extend downwards and the upper terminals 1340*u* extend upwards from the substrate 1335 (with the same height). The lower terminals 1340*l* connect the contacts 1310*l* of the lower chips 1305*l* and the upper terminals 1340*u* connect the contacts 1310*u* of the upper chips 1305*u*, so as to obtain a 3-dimensional structure (that is then embedded into a package).

MODIFICATIONS

Naturally, in order to satisfy local and specific requirements, a person skilled in the art may apply to the solution(s) described above many modifications and alterations. Particularly, although the present invention has been described with a certain degree of particularity with reference to embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, the proposed solution is suitable to be used with any electrical contacts of any electronic devices (such as stud bumps for LCD devices). In any case, one or more embodiments of the present invention may be implemented with terminals having different shapes (for example, conical or frusto-conical shapes) or sizes; similar considerations apply if the terminals are formed on an equivalent substrate.

Without departing from the principles of the invention, the covering can include a different number of metallic layers (even of other metals).

Similar considerations apply if the terminals deform in a different way (when they are pressed against the corresponding bumps).

Likewise, the nano-balls can be made of different (conductive and/or magnetic) materials, or they can be replaced with equivalent elements (such as in the form of nano-powder).

In any case, any combination of triangular-profile and trapezoidal-profile terminals (with the same or different heights) is possible in every application.

Similar considerations apply if the probe card, the sockets or the burn-in board have another structure or include equivalent elements; in any case, the use of the proposed solution in any other test process (for example, of the functional type) is contemplated.

The concepts of the invention may also apply to different power assemblies and/or multi-chip modules; alternatively, the same interconnection element can be associated with two or more boards facing each surface thereof.

Likewise, it is possible to mount any other circuit for driving the power chips on top of the above-described assembly.

A system according to an embodiment of the present invention also leads itself to be manufactured with equivalent processes (including similar or additional steps).

In any case, the layers of porous silicon can be obtained with equivalent processes (having other operative parameters); moreover, they can have a different width and/or porosity.

It should be noted that the described shape and depth of the windows and grooves, respectively, are merely illustrative and must not be interpreted in a limitative manner.

Principles of the invention may also apply to equivalent techniques for selectively exposing the photoresist layer.

Moreover, it will be apparent to those skilled in the art that the additional features providing further advantages are not essential for carrying out the invention, and may be omitted or replaced with different features.

For example, the core can be of any other polymeric material with the desired mechanical and/or electrical characteristics (for example, neoprene); likewise, the covering can be made of any other conductive material.

In any case, the use of a core embedding the conductive material or the magnetic material only, or the use of a core simply made of the polymeric material (without any nano-ball) is within the scope of the invention.

In addition, the use of a core with a different elasticity (either for the trapezoidal-profile or the triangular-profile terminals) is not excluded.

A solution according to one or more embodiments of the present invention also leads itself to be implemented with any other mono- or multi-dimensional structure (for example, replicating the above-described stack one or more times).

Even though in the preceding description reference has been made to the contacting of electronic devices for test purpose or for interconnecting chips, this is not to be intended in a limitative manner; indeed, a solution according to one or more embodiments of the invention is also suitable to be used in any other application.

Likewise, the principles of the invention should not be limited to the described manufacturing processes.

For example, the use of other techniques (even based on no sacrificial structures) is contemplated.

In addition, production processes that do not involve the formation of any layer of porous silicon are not excluded (even if they are far less advantageous).

Similar considerations apply if a single layer of porous silicon is formed.

In any case, the technique based on the etching of the wafer can be implemented for obtaining triangular-profile or trapezoidal-profile terminals only.

Moreover, a single repetition of the etching process is enough in many applications.

It should be noted that the provision of the further stop layer is not essential for carrying out the invention (with the depth of the grooves that can be controlled according to the duration of the etching process).

At the end, other techniques for providing grooves extending at a variable angle are not excluded.

The invention claimed is:

1. A process of manufacturing a system for contacting at least one electronic device having a plurality of contact elements, the process including the steps of:
   providing a substrate having a main surface, and
   forming a plurality of contact terminals projecting from the main surface, wherein each contact terminal includes a core and a covering of conductive material surrounding the core, the covering having an operative portion spaced apart from the main surface for electrically connecting a corresponding contact element and a lateral portion extending between the main surface and the operative portion,
   wherein the lateral portion forms an angle with the main surface between 45° and 75°;
   wherein the step of forming the contact terminals includes:
      providing a sacrificial structure having a substantially flat exposed surface, the sacrificial structure including a wafer of semiconductor material having a working surface corresponding to the exposed surface,
      selectively etching the sacrificial structure to form a plurality of grooves on the exposed surface corresponding to the contact terminals,
      depositing at least one first metallic layer on the exposed surface of the sacrificial structure,
      filling the grooves with the polymeric material,
      depositing at least one second metallic layer on the at least one first metallic layer to obtain a structure including the contact terminals,
      associating the structure with the substrate, and
   removing the sacrificial structure.

2. The method according to claim 1, further including the step of:
   forming at least one layer of porous silicon extending from the working surface into the wafer.

3. The process according to claim 1, wherein the wafer includes a crystal plane acting as an etching stopper, the crystal plane forming a predefined angle with the working surface, the step of selectively etching the sacrificial structure including:

covering the working surface with a protecting layer, opening a plurality of windows with predefined shapes in the protective layer for the grooves, and wet etching the wafer through the windows for a predefined etching time, the etching being substantially stopped when the crystal plane is exposed thereby forming the corresponding grooves extending at the predefined angle from the working surface.

4. The process according to claim 3, wherein the etching time is higher than a first time required to have only the crystal plane exposed in at least one first groove, thereby having the at least one first groove end with an edge or vertex matching the operative portion of the corresponding terminal.

5. The process according to claim 3, wherein the etching time is lower than a second time required to have only the crystal plane exposed in at least one second groove, thereby having the at least one second groove end with a plane surface matching the operative portion of the corresponding terminal.

6. The process according to claim 3, wherein the step of selectively etching the sacrificial structure includes at least one repetition of covering the working surface with the protecting layer, opening the windows in the protective layer, and wet etching the wafer through the windows, each repetition having a different size of the windows and/or a different etching time.

7. The process according to claim 3, wherein the step of selectively etching the sacrificial structure further includes:

forming a further stop layer at a predefined depth inside the wafer, the further stop layer being parallel to the working surface.

8. The process according to claim 7, wherein the further stop layer consists of a layer of semiconductor material having a crystallographic orientation or a concentration of P-type impurities substantially preventing the etching.

9. The process according to claim 1, wherein the step of selectively etching the sacrificial structure includes:

covering the working surface of the wafer with a photoresist layer, exposing the photoresist layer in selected regions, the photoresist layer being exposed with a changing intensity moving from an edge portion towards a central portion of each selected region, removing the photoresist in the selected regions according to the exposition, thereby forming the corresponding grooves.

10. The process according to claim 1, wherein the sacrificial structure is formed on a wafer of semiconductor material.

11. The process according to claim 1, wherein the flat exposed surface further comprises a crystallographic orientation defined by Miller index <100>.

12. The process according to claim 1, wherein the lateral surface of the contact forms an angle with the base that ranges from 53° to 65°.

13. The process according to claim 1, wherein the depositing at least one second metallic layer further comprising depositing a second metallic layer that is substantially flat.

14. A process of manufacturing a system for contacting at least one electronic device having a plurality of contact elements, the process including the steps of:

providing a substrate having a main surface, and forming a plurality of contact terminals projecting from the main surface, wherein each contact terminal includes a core and a covering of conductive material surrounding the core, the covering having an operative portion spaced apart from the main surface for electrically connecting a corresponding contact element and a lateral portion extending between the main surface and the operative portion, wherein the lateral portion forms an angle with the main surface between 45° and 75°;

wherein the step of forming the contact terminals includes:

providing a sacrificial structure having an exposed surface, the sacrificial structure including a wafer of semiconductor material having a working surface corresponding to the exposed surface, selectively etching the sacrificial structure to form a plurality of grooves on the exposed surface corresponding to the contact terminals, depositing at least one first metallic layer on the exposed surface of the sacrificial structure, filling the grooves with the polymeric material, depositing at least one second metallic layer on the at least one first metallic layer to obtain a structure including the contact terminals, associating the structure with the substrate, and removing the sacrificial structure;

the process further including the step of forming at least one layer of porous silicon extending from the working surface into the wafer; and wherein the at least one layer of porous silicon includes an outer layer extending from the working surface and an inner layer extending from the outer layer, the outer layer having a porosity lower than a porosity of the inner layer.

15. The method according to claim 14, wherein the porosity of the outer layer is lower than 40% and the porosity of the inner layer is higher than 50%.

* * * * *